(12) United States Patent
Hagenbuch

(10) Patent No.: US 7,257,467 B2
(45) Date of Patent: Aug. 14, 2007

(54) METHOD OF ESTIMATING THE VOLUMETRIC CARRYING CAPACITY OF A TRUCK BODY

(76) Inventor: LeRoy G. Hagenbuch, 502 W. Northgate Rd., Peoria, IL (US) 61614

( * ) Notice: Subject to any disclaimer, the term of this patent is extended or adjusted under 35 U.S.C. 154(b) by 0 days.

(21) Appl. No.: 10/286,095

(22) Filed: Nov. 1, 2002

(65) Prior Publication Data

US 2003/0088340 A1    May 8, 2003

Related U.S. Application Data

(60) Provisional application No. 60/336,064, filed on Nov. 2, 2001.

(51) Int. Cl.
*G05D 1/00* (2006.01)
*B65H 1/00* (2006.01)

(52) U.S. Cl. .......................... 701/1; 414/806

(58) Field of Classification Search ............ 701/1; 414/199, 222.01, 222.02, 785, 804, 806–808; 222/173, 612, 154, 157; 296/183–184; 73/149, 73/865.8, 866, 866.4
See application file for complete search history.

(56) References Cited

U.S. PATENT DOCUMENTS

| | | | |
|---|---|---|---|
| 4,190,265 A | | 2/1980 | Goodbary et al. |
| 4,614,477 A | * | 9/1986 | Hagenbuch ............ 414/809 |
| 4,684,152 A | | 8/1987 | Goodbary et al. |
| 4,691,792 A | | 9/1987 | Shintani |
| 4,813,004 A | * | 3/1989 | Fujioka et al. ............ 702/173 |
| 5,259,322 A | * | 11/1993 | Dominguez et al. ......... 105/4.1 |
| 5,404,661 A | | 4/1995 | Sahm et al. |
| 5,474,363 A | | 12/1995 | Hagenbuch |
| 5,531,122 A | | 7/1996 | Chatham et al. |
| 5,650,930 A | | 7/1997 | Hagenbcuh |

(Continued)

FOREIGN PATENT DOCUMENTS

WO        WO 00/76805 A1    12/2000

OTHER PUBLICATIONS

International Organization for Standardization, ISO 6483-1980 (E), "Earth-Moving Machinery-Dumped Bodies-Volumetric Rating," Sep. 1980.

(Continued)

*Primary Examiner*—Thu V. Nguyen
(74) *Attorney, Agent, or Firm*—Leydig, Voit & Mayer

(57) ABSTRACT

A method for estimating the effective volumetric capacity of a truck body is provided. The method includes the step of establishing a side-to-side profile of a generic load model. A front-to-rear profile of the generic load model is also established. Load plateau lines having predetermined dimensions are established in the front-to-rear and side-to-side profiles and the height of the plateau lines are determined. A top profile of the generic load is then created and the shape of the load plateau is adjusted into a closed curve shape. The front, rear and side load lines below the final outer boundary of the load plateau are then contoured into a generally conical shaped surface. The final three-dimensional generic load model is formed by where this generally conical shaped surface intersects the sides walls, front and floor of the truck body. The volume of the final three-dimensional generic load model can then be calculated.

20 Claims, 16 Drawing Sheets

U.S. PATENT DOCUMENTS

| | | | |
|---|---|---|---|
| 5,815,960 | A | 10/1998 | Soczka |
| 5,844,564 | A | 12/1998 | Bennis et al. |
| 5,857,825 | A | 1/1999 | Rice |
| 5,887,914 | A | 3/1999 | Hagenbuch |
| 5,936,869 | A | 8/1999 | Sakaguchi et al. |
| 6,022,068 | A | 2/2000 | D'Amico |
| 6,106,072 | A | 8/2000 | Lutter, Jr. |
| 6,157,889 | A | 12/2000 | Baker |
| 6,313,414 | B1* | 11/2001 | Campbell .................... 177/16 |
| 6,374,201 | B1 | 4/2002 | Grizon et al. |

OTHER PUBLICATIONS

Society of Automotive Engineers, Inc., SAE Construction, Agricultural and Off-Road Machinery Standards Manuel HS-2800 "Capacity Rating-Dumper Body and Trailer Body," Jan. 1985, p. 380-381.
Caterpillar Inc., Product Division, Field Representative Information Release, N149F "769 Series B Truck," Aug. 1966, p. 1-21.
Caterpillar Inc., Brochure AE026730 "Caterpillar 769 Series B," Applicants believe available in 1967.
Caterpillar Inc., Brochure AEHQ5186 "Caterpillar 793C Mining Truck," Copyright 1996.
Euclid Inc., Form 12-015 "Euclid R-85 Specifications," Aug. 1977.
Euclid Inc., Form 12-028 "Euclid R-85 Hauler Specifications," Sep. 1985.
VME Americas Inc., Form RH-483 "Euclid R85 B, " Jan. 1991.
Euclid Inc., Form RH-483 R1 "Euclid R85B Haul Units,"Aug. 1994.
Caterpillar, "Mine Specific Design (MSD) Body Program," from CD distributed Oct. 2000 at Mine Expo 2000.
Conymet, "Photometry Software Tool for Volumetric and Load Distribution Study," downloaded from www.conymet.com; Nov. 26, 2002.
Conymet, "High Efficiency Body (HE Series)," from presentation given May 2002 at Haulage 2002 Conference.
Disca, "DT-HILOAD Haulage 2002," from presentation given May 2002 at Haulage 2002 Conference.
Angles of Repose Diagrams, undated (created after filing date of present application).
Selected charts and diagrams from a of Philippi-Hagenbuch, Inc., presentation undated (created after filing date of present application).
Caterpillar 769B Truck product brochure; Aug. 1966.
Caterpillar 769B Truck product brochure specification; undated (applicants believe available in the late 1960's to early 1970's).
Caterpillar 769B Truck product brochure; Mar. 1974.
Hagenbuch, LeRoy G.; "Adapting the Off-Highway Truck Body Volumetric Process to Real World Conditions," *SAE Technical Paper Series; 2000*; undated (applicants believe available in the late 1960's to early 1970's).
Duff, Elliott, "*Automated Volume Measurement of Haul-Truck Loads*", CSIRO Manufacturing Science and Technology, Presented at Open Coal Cut Operations Conference, Mackay, Queensland, Jun. 16, 2000.
Hagenbuch, LeRoy G., SME Preprint 02-137 entitled "*Off-Highway Truck Body True Capacity . . . Why Can't I Get Rated Payload on My Off-Highway Truck Without Hungry Boards and Tail Extensions*".
"Capacity Rating—Dumper Body and Trailer Body—SAE J1363 Nov. 95," *1999 SAE Handbook-Volume 3 On-Highway Vehicles and Off-Highway Machinery, Society of Automotive Engineers,Inc.*.
"Komatsu Price Changes," *Equipment Watch Price Alert*, Aug. 2002.
Komatsu 930E-2 truck spec sheet, Jun. 2002.
Caterpillar 777D Off-Highway Truck, spec sheet, Jun. 2000.
"Angles of Repose (Heap)"; Chart, Philippi-Hagenbuch, Inc. 2003.
Oner, Mete, "Deep Dark Secrets of Geotechnical Engineering," *EJGE/Magazine*, internet article 1997; p. 1-4.
"B.2.60 Angle of Repose," web page from *Michigan State University Department of Physics and Astronomy Lecture Demonstrations Databases*, downloaded Sep. 28, 2003.

"Angle of Repose," web page from *NCSU Physics DemoRoom*, downloaded Sep. 28, 2003.
"Angle of Repose," web page from www.HyperDictionary.com, downloaded Sep. 28, 2003.
"Angle of Repose," web page from *University of Texas at Austin Physics Department*, downloaded Sep. 28, 2003.
Faris, Roger, "Find Your Safe Angle of Repose," internet article from *The Seattle Press*, downloaded Sep. 28, 2003.
"Mass Wasting and the Angle of Repose," internet article from http://phoenix.liuent.edu/~divernere/notes/angle_of_repose.htm; p. 1-3, downloaded Sep. 28, 2003.
Angle of Repose diagram from Brunner Mond, undated.
"Angle of Repose," charts from web page http://www.geol.umd.edu/~kaufman/ppt/chapter8/sld006.htm; p. 1-2, downloaded Oct. 4, 2003.
Lee, J. et al., "Angle of Repose and Angle of Marginal Stability: Molecular Dynamics of Granular Particles," abstract article from www.IOP.org/EJ/abstract/0305-4470/26/2/01; p. 1-2, Jan. 21, 1993.
"Angle of Repose," web page from www.RCRC.nm.org/glossary/gl-angle-of-repose.html, downloaded Sep. 28, 2003.
Olson, C.J. et al., "Effect of Grain Geometry on Angle of Repose and Dynamics," internet article from www.eps.org/aps/meet/MAR01/baps/abs/S338005.html, downloaded Sep. 28, 2003.
"Effect of Water on the Angle of Repose," slide 2 of 35 from internet site www.ideo.columbia.edu/dees/ees/ies2/masswasting/sld002.html, downloaded Sep. 28, 2003.
"Dynamics Angles of Repose," internet article from http://groups.physics.umn.edu/sand/theory.shtml; p. 1-2, downloaded Sep. 28, 2003.
Morisawa, Marie, "Stable Angles of Slopes," from www.beloit.edu/~SEPM/EArth_Works/Stable_angles_of_slopes.html; p. 1-4, downloaded Sep. 28, 2003.
Park, Brien, "What do you suppose is the "angle of repose"?," web article from www.nps.gov/brca/Geodetect/Earth%20Systems/angle%20of%20repose.htm; p. 1-4, Jul. 9, 2002.
"Sand Angels," web article from www.edgerton.org/kidscorner/sandangels.html; p. 1-2, downloaded Sep. 28, 2003.
"Sand Piles," web page from http://van.hep.uiuc.edu/van/qa/section/Everything_Else/Hard_to_Categorize/924816567.htm, downloaded Sep. 28, 2003.
"Slope Stability Lab," web page from www.geo.arizona.edu/K-12/azpepp/education/activity/la.html; p. 1-4, downloaded Sep. 28, 2003.
"The Angle of Repose and the Static Coefficient of Friction," web page from www.redcompservices.com/Pcourses/Phys1/repose.htm; p. 1-2, downloaded Sep. 28, 2003.
Prompalagorn, Wiroj et al., "Priction Coefficient & Angle of Repose Equipments," web abstract from http://library.kmitnb.ac.th/projects/eng/MHT/mht0096e.html, 1996.
"Slope Stability Lab," p. 1-4 (undated).
"Angle of Repose," slide 3 of presentation, http://www3.uakron.edu/geography/lrb/physf97/lectures/masswaste/sld003.htm, downloaded Sep. 28, 2003.
Chase, George G., "Solids Notes," University of Akron (undated), pp. 4-1 and 4-2.
"Mass Wasting," (undated); p. 1-7.
"CHASM: Cone Handling Algorithms for Stockpile Modeling," web article from www.cmis.csiro.au/PPI/RecentProjects/CHASM.htm; p. 1-3, downloaded Sep. 28, 2003.
"Axial Segregatoin in Binary Granular Flows," abstract from www.aae.uiuc.edu/floatn/C%20PROJ/pp02-03f.htm; p. 1-2, downloaded Sep. 28, 2003.
Bulk-Store Structures Inc. internet brochure from www.bulk-store.ca/fert.html; p. 1-3; 2000.
Commercial Hopper Tank Storage Capacities and Heights spec sheet; 2002.
"Volcanism Behind the Main Arc," web page from www.rci.rutgers.edu/~carr/fieldtrip/fieldtext/cuilapa_fldtxt.htm, downloaded Sep. 28, 2003.
"Screening Equipment," SMICO Manufacturing web page www.smico.com, downloaded Oct. 1, 2003.
"Material Bulk Density Reference Chart," SMICO Manufacturing; p. 1-20 (undated).

"Material Angles of Repose," chart from Philippi-Hagenbuch, Inc., 2003.
Photographs from Caterpillar brochures featuring: 785 Truck (4-88) -AEHQ7006, (undated).
"New Technology to Measure Mining Haul Truck Loads," CSIRO Press Release Jul. 1, 2003.
"New Technology to Measure Mining Haul Truck Loads," article from http://www.cmit.cisro.au/innovation/2003.08; p. 1-2, downloaded Aug. 22, 2003.
"A Proud History," *Euclid Haulers* brochure; p. 2; 1988.
"Earth-Moving Machinery-Dumper Bodies-Volumetric Rating," *International Standard ISO 6483* ; 1980, p. 1-5.
"Caterpillar Price Changes," *Equipment Watch Price Alert*, Jan. 2003.
"Mining Lifts Goldfields Crane Hire," *Australia Mining Monthly*; Dec. 2002, p. 67.
"Detroit Diesel-We'll Move Mountains for You," *Australia Mining Monthly*; Aug. 2003.
"Trucks & Shovels,"*World Mining Equipment*; Sep. 2003, vol. 27, No. 7 (including Komatsu PC 3000 ad and truck/shovel loading photos).
*North American Quarry News*, 2003-DBT Mineral Processing ad.
*Mining Engineer*, front cover; May 2003.
"P&H 2800 XP Shovel," *Perspective in Mining*, vol. 7, No. 2, p. 4.
"Excavator Selection," *Peak & Performance Practices*, front cover.
"Angle of Repose," web page from *Michigan State University*, downloaded Sep. 28, 2003.
"Angle of Repose and Angle of Marginal Stability," web page from http://www.hlrs.de/people/mueller/papers/parallelMD99/node3.html, downloaded Sep. 28, 2003.
Excerpt from "Highways in the River Environment," p. 1-4; 1975.
Hudson, Ralph G., *The Engineers'Manual*; Second Edition 1963; p. 101-102.
"*Storage of Farm Crops,"* Agricultural Engineers'Handbook*; p. 691, 1961.
"Approximate Angle of Repose of Various Materials," *Caterpillar Performance Handbook*; Jan. 1972, p. 25.
"Tables-Angle of Repose of Various Materials," *Caterpillar Performance Handbook*, Oct. 2002, p. 26-1.
Photographs from Caterpillar brochures featuring 785C Mining Truck (4-02)-AEHQ5328-02, undated.
Photographs from Caterpillar brochures featuring 785/789 Truck (AEDK1468), undated.
Photographs from Caterpillar brochures featuring 775B Truck (4-94)-AEHQ3874, undated.
Photographs from Caterpillar brochures featuring 773E Truck (11-01)-AEHQ5456, undated.
Photographs from Caterpillar brochures featuring 775E Truck (11-01)-AEHQ5457, undated.
"Density of Common Materials," *The Excavators 5th Edition-Hitachi*; sections 11-36:11-39 (undated).
"Tables: Weight of Materials," *Caterpillar Performance Handbook Edition 33*, Oct. 2002.
Sideview drawing showing Ten Different Load Configurations-Load Heaps for the Caterpillar 769B Body, created by Philippi-Hagenbuch, 2003.
"Four "A" Size Isometric Drawings displaying one each possible 1.7:1 load configuration-load heap," for the Caterpillar 769B Truck; created by Philippi-Hagenbuch, 2003. 1) 1.7: 1 Heap (1.1 at rear) 30.2 cu yd.; 2) 1.7:1 (True Heap) 27.5. cu yd. 3) 1.7:1 Profiled Heap (to a point) 26.0 cu yd.; and 4) 1.7:1 Profiled Heap (with top plateau) 25.8 cu yd.
"3M Mining" advertisement in *Mining Monthly*; Aug. 2003.
CSIRO-Common Wealth Scientific & Industrial Research Organization of Australia; website home page, downloaded Oct. 5, 2003.
"2:1 Heap," *Euclid-Hitachi* brochure; 1995, p. 1-6.
"2:1 SAE Heap," *Euclid-Hitachi* brochure; p. 4; 1999.
"2:1 SAE—Euclid R130," *VME Americas Inc.*; p. 4, 1989.
"2:1 SAE—Euclid R190," *VME Americas Inc.*; 1990, p. 1-6.
"2.1 SAE—Euclid R25," *Euclid Inc.*; 1982.
"2:1 Field Heap—Euclid R35," *Euclid Inc.*; 1983.
"SAE 2:1 Rated Heap," *VME Industries North America*; 1992.
Hagenbuch, LeRoy G., SME Preprint 02-137 entitled "Off-Highway Truck Body True Capacity . . . Why Can't I Get Rated Payload on My Off-Highway Truck Without Hungry Boards and Tail Extensions", presented at the 2002 SME Annual Meeting, Feb. 25-27, Phoenix, Arizona.
Caterpillar General Dimensions 769B Truck (undated).
Caterpillar Body Assembly 769B Truck (undated).
Liffman, Kurt et al., "*Stress In Sandpiles*" presented at the *Second International Conference on CFD in the Minerals and Process Industries CSIRO*, Melbourne, Australia Dec. 6-8, 1999, pp. 83-87.
Singh, Sanjiv, "The State of the Art in Automation of Earthmoving", *In ASCE Journal of Aerospace Engineering*, vol. 10, No. 4, Oct. 1997, pp. 1-29.
Fesak, George M., et al. "*Analysis of Surface Powered Haulage Accidents*", Mine Safety and Health Administration, US Department of Labor, Sep. 1996, 11 pages total.
Stentz, Anthony, et al., "*A Robotic Excavator for Autonomous Truck Loading*", Autonomous Robots 7, 1999, pp. 175-186.

* cited by examiner

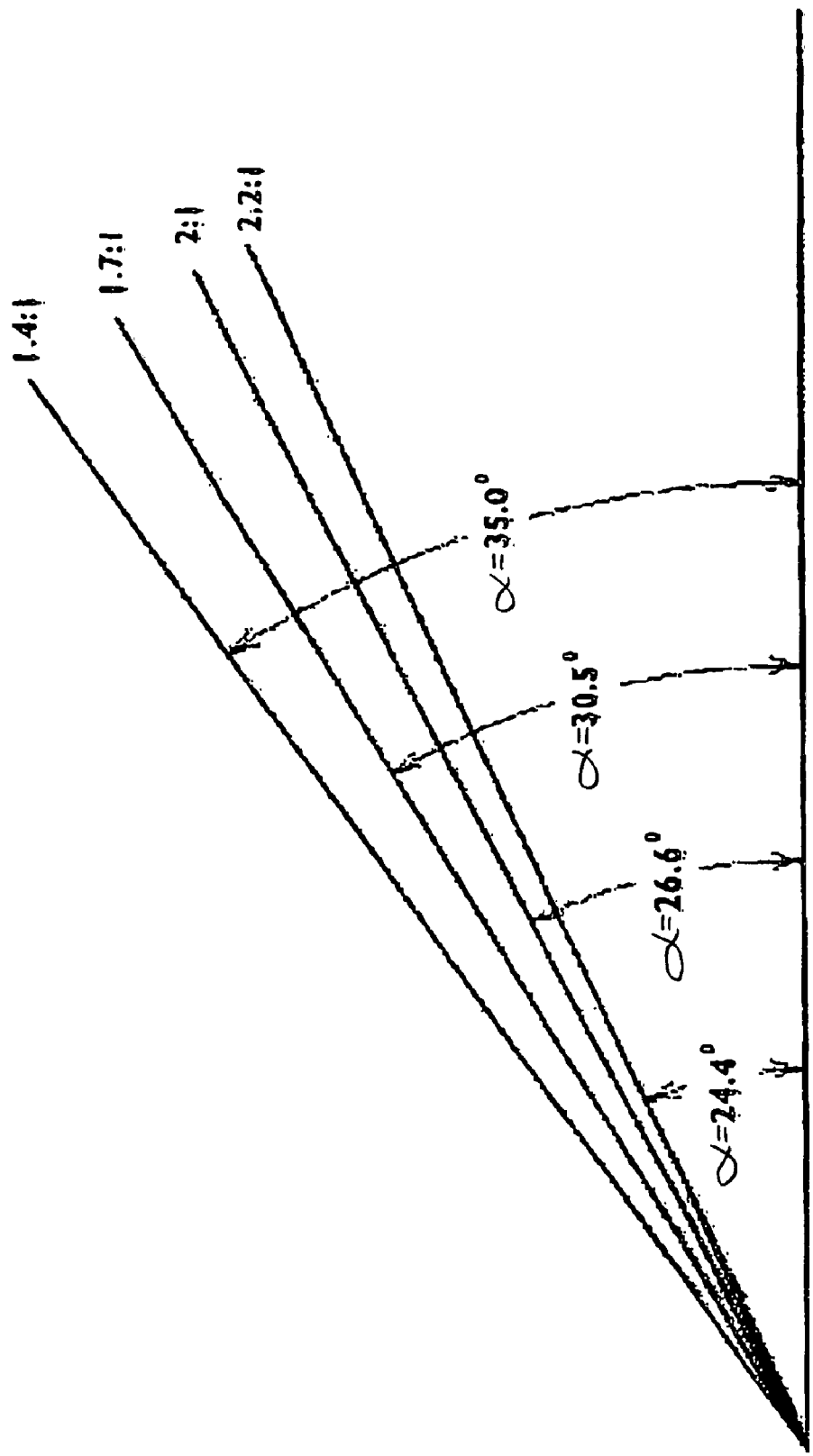

102.6 cu.m.
134.2 cu.yd.

114.8 cu.m.
150.2 cu.yd.

125.3 cu.m.
163.9 cu.yd.

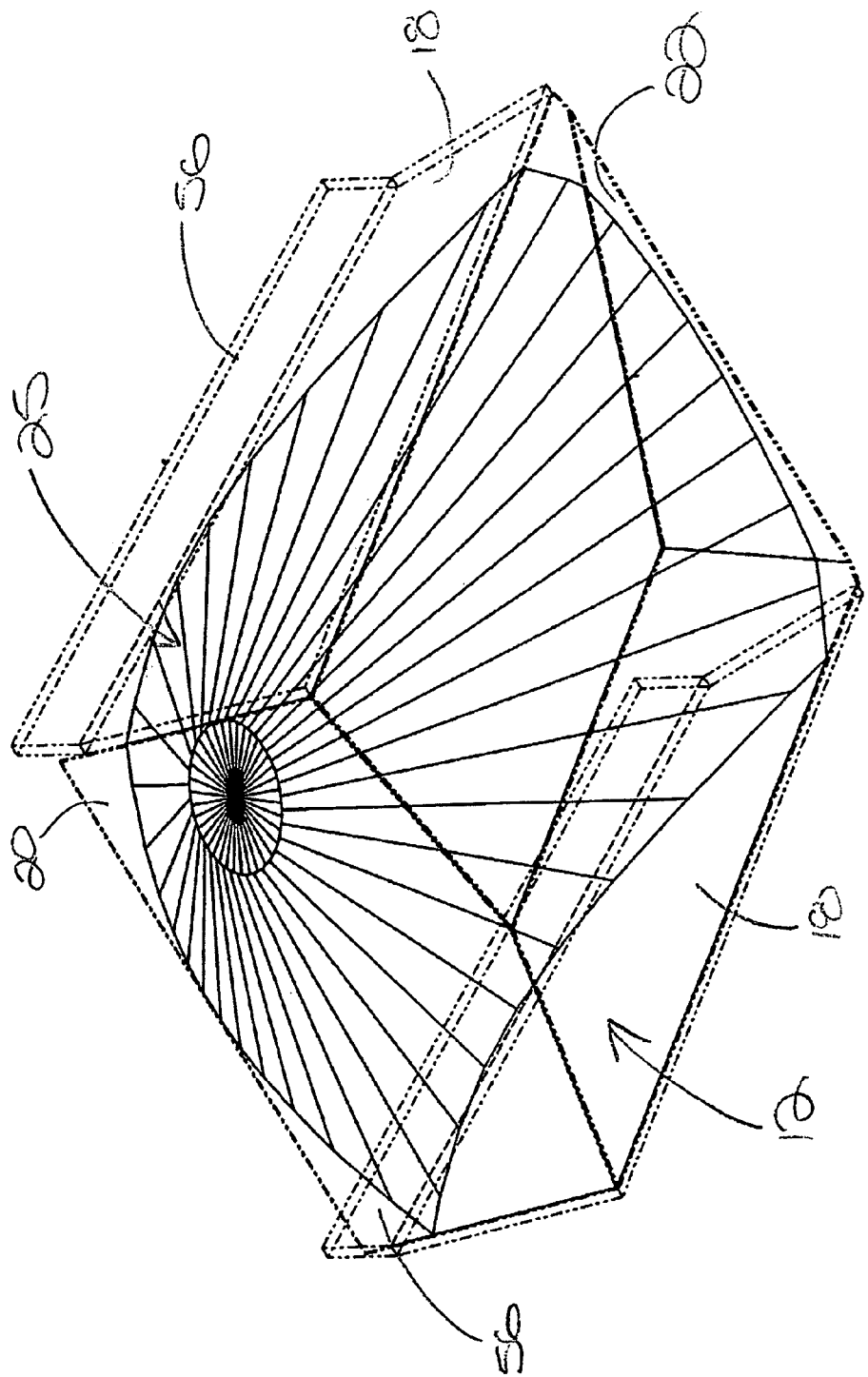

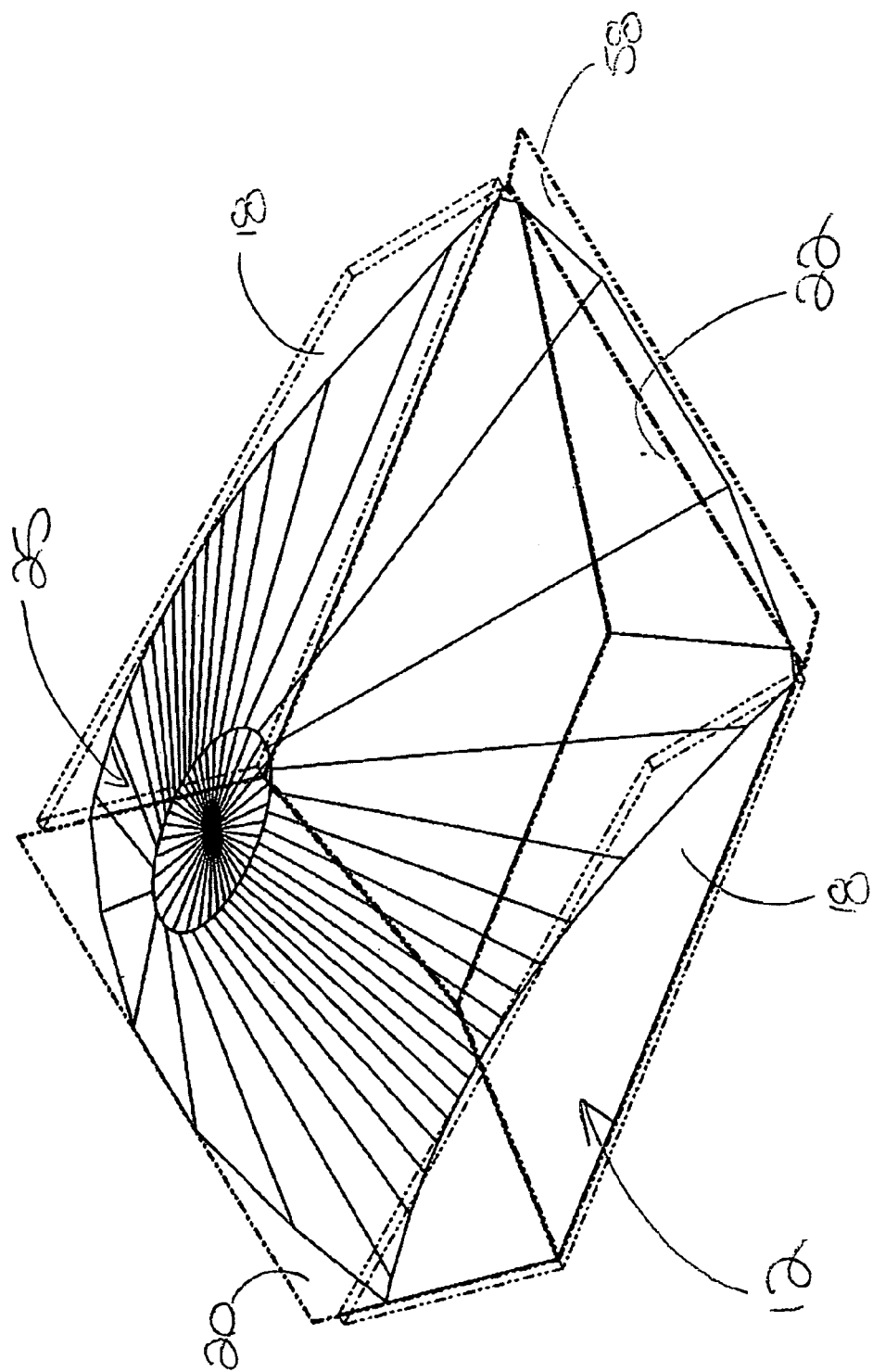

METHOD OF ESTIMATING THE VOLUMETRIC CARRYING CAPACITY OF A TRUCK BODY

CROSS-REFERENCE TO RELATED PATENT APPLICATIONS

This patent application claims the benefit of U.S. Provisional Patent Application No. 60/336,064, filed Nov. 2, 2001.

FIELD OF THE INVENTION

This invention relates generally to off-highway trucks and more particularly to a method of calculating the estimated volumetric carrying capacity of the body of an off-highway truck.

BACKGROUND OF THE INVENTION

In mining and construction environments, off-highway trucks are used to haul a variety of different materials such as, for example, coal, rock, ore and overburden materials (i.e. the material overlying ore/coal deposits). Such off-highway trucks generally comprise a truck chassis or frame, which supports a truck body for receiving and carrying a load.

The carrying capacity of a truck is defined by two parameters: the weight or load carrying capacity of the truck and the volumetric carrying capacity of the truck body. These two parameters must be synchronized with the density of the material to be carried by the truck to ensure that the truck is properly utilized. If not, the truck can be operating either under capacity, i.e. short in payload, or over capacity, i.e. with a heavier than desired payload.

The truck manufacturer defines the weight carrying capacity of an off-highway truck. For a given haulage application, dividing the truck weight carrying capacity by the density of the material to be carried yields the required optimal volumetric carrying capacity for the truck body in that application.

Presently, off-highway truck manufacturers provide a volumetric capacity rating for their truck bodies that is presently based on the Society of Automotive Engineers (SAE) Standard SAE J1363 (January 1985, reaffirmed November 1995) ("the SAE standard"). Unfortunately, however, this SAE standard does not provide a very accurate estimate of the actual volumetric carrying capacity of a truck body.

The SAE standard rates the volumetric capacity of a truck body both in struck and heaped volumetric capacities. The sum of its struck volume and its 2:1 heap above the struck volume/struck line is its 2:1 heaped volume. Under the SAE standard, the struck volume of large off-highway truck dump bodies is based on an assumed struck load which extends upward from the rear edge of the floor of the truck body (on open ended truck bodies) at a 1:1 slope (corresponding to a material angle of repose of 45 degrees) to the top edge of the side walls of the body. The heaped volume is based on an assumed load heap defined by the truck body sides and the line defined by the intersection of the rear struck line and the body sides and extends upwards at a 2:1 slope (corresponding to an angle of repose of 26.6 degrees).

There are major dimensional problems with the SAE 2:1 heaped volumetric rating methodology set forth in the SAE standard. First, with respect to the struck volume calculation, there are very few materials that will stand at a 1:1 slope in a static condition let alone in a dynamic condition, i.e. when the truck is moving. Second, the heaped volume calculation is based on a different slope or material angle of repose than is used in calculating the struck volume. Thus, the SAE standard essentially assumes a load that does not have a constant material angle of repose, i.e. a load wherein the angle of repose of the load material at the rear of the truck body changes from 45 degrees to 26.6 degrees above the side walls of the truck body. In the real world, each particular side of a load heap carried in a truck body nearly always has a substantially constant angle of repose. However, it should be noted, that each side of a load heap, i.e. front, back, left and right may not always have the same angle of repose.

The third major problem with the methodology of the SAE standard is that it attempts to define the load heap by a series of four flat planes, which together resemble the roof of a house. In actuality, load heaps carried in truck bodies have a configuration that is more conical in shape.

Accordingly, the methodology of the SAE standard is based on a load model that is different in several critical respects from the actual real world configuration of a load carried by a truck body. As a result, the SAE standard produces a truck body volumetric capacity rating that does not accurately reflect the actual achievable volumetric carrying capacity of a truck body. In fact, the SAE standard consistently overrates the volumetric carrying capacity of a truck body. This is recognized in certain South American countries where the practice is to "de-rate" the SAE standard volumetric capacity of a truck body to 85% of the volumetric rating produced by the SAE standard. This method, however, also provides little more than a rough estimate of the actual volumetric carrying capacity of a truck body.

Since the SAE standard substantially overrates the actual volumetric weight carrying capacity of a truck body, off-highway truck users typically are unable to achieve the full load-carrying capabilities of their truck. Moreover, attempts to match the effective volumetric carrying capacity of a truck body with the materials being hauled and the weight carrying capacity of the truck so as to achieve full payload utilization of the truck amount to little more than guesswork because of the inaccuracy of the SAE standard. Accordingly, a need exists for a method to accurately estimate the effective volumetric carrying capacity of a truck body.

BRIEF SUMMARY OF THE INVENTION

The invention provides a method for rating or estimating the effective volumetric carrying capacity of a truck body. The method includes a Step A where a side-to-side profile of a generic load model is established by extending load side lines upward at a predetermined material angle of repose from the upper edge of each of the side walls of the truck body. In Step B, a front-to-rear profile of the generic load model is established by extending a front load line upward from the upper edge of the front wall of the truck body at the predetermined material angle of repose and a rear load line upward from at or near a rear edge of the floor of the truck body at the predetermined material angle of repose. Step C consists of defining a load plateau plane having predetermined dimensions in the front-to-rear and side-to-side profiles and determining the height of the load plateau plane. In Step D, the top profile of the generic load is then created from the side-to-side and front-to-rear profiles and the shape of the load plateau is then adjusted into a closed curve shape. In step E, the front, rear and side load lines below the final outer boundary of the load plateau are contoured into a generally conically shaped surface in which the sides of the conically shaped surface are inclined at the predetermined material angle of repose. This forms a final three-dimensional generic load model defined by the load plateau and where the generally conically shaped surface intersects the side walls, front wall and floor of the truck body. In Step F, the volume of the final three-dimensional generic load model is calculated.

BRIEF DESCRIPTION OF THE DRAWINGS

FIG. 2a is a diagram representing exemplary material angles of repose with corresponding material slopes of 2.2:1-1.4:1.

FIG. 16 is a perspective view of a truck body having sideboards showing how the addition of the sideboards affect the volumetric carrying capacity rating of the truck body as calculated according to the present invention.

FIG. 17 is a perspective view of a truck body having a tail extension showing how the addition of the tail extension affects the volumetric carrying capacity rating of the truck body as calculated according to the present invention.

DETAILED DESCRIPTION OF THE INVENTION

Figure 1:
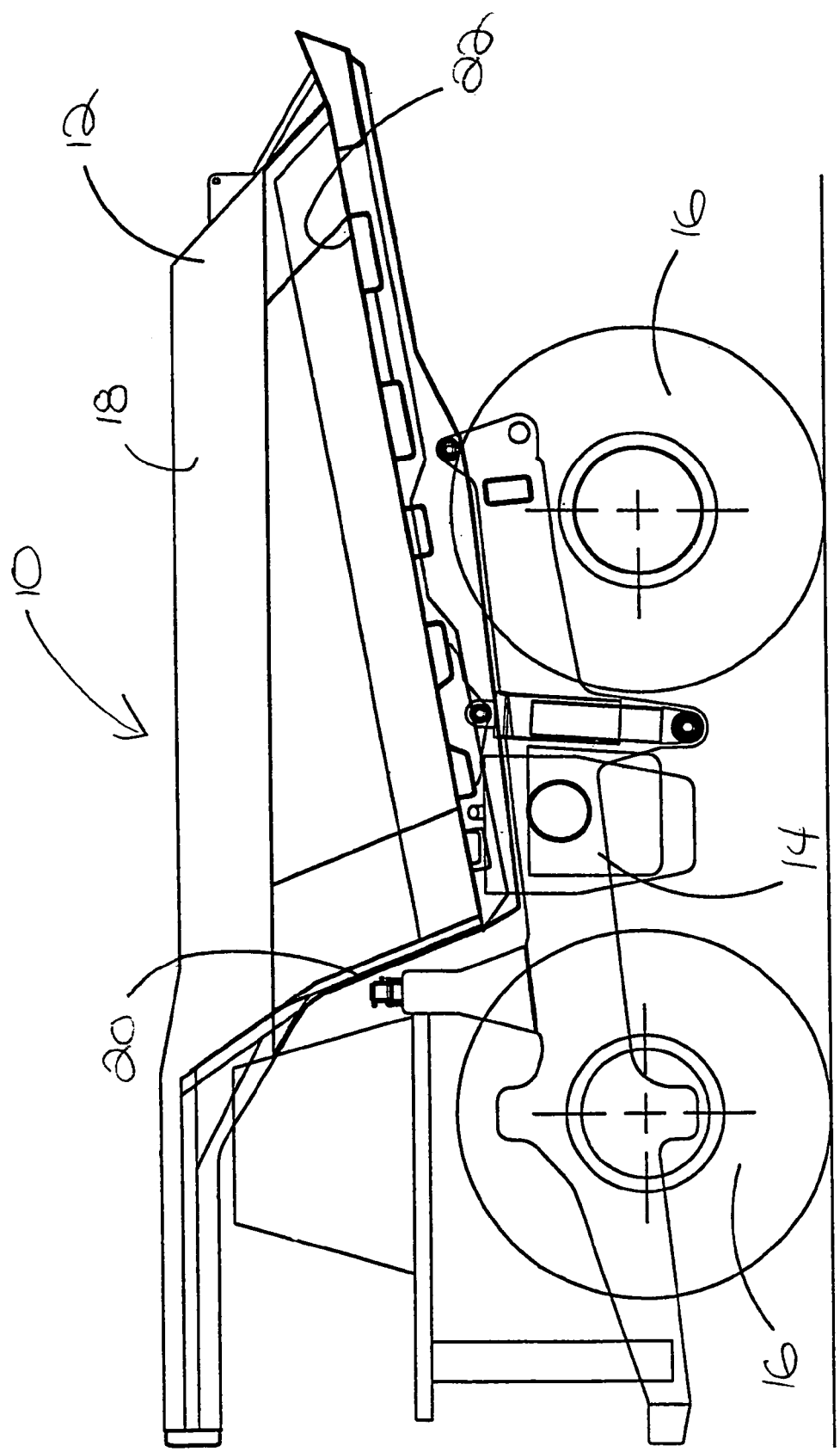
FIG. 1 is a side view of an exemplary off-highway truck having a truck body the capacity of which can be rated using the method of the present invention.
Figure 2:
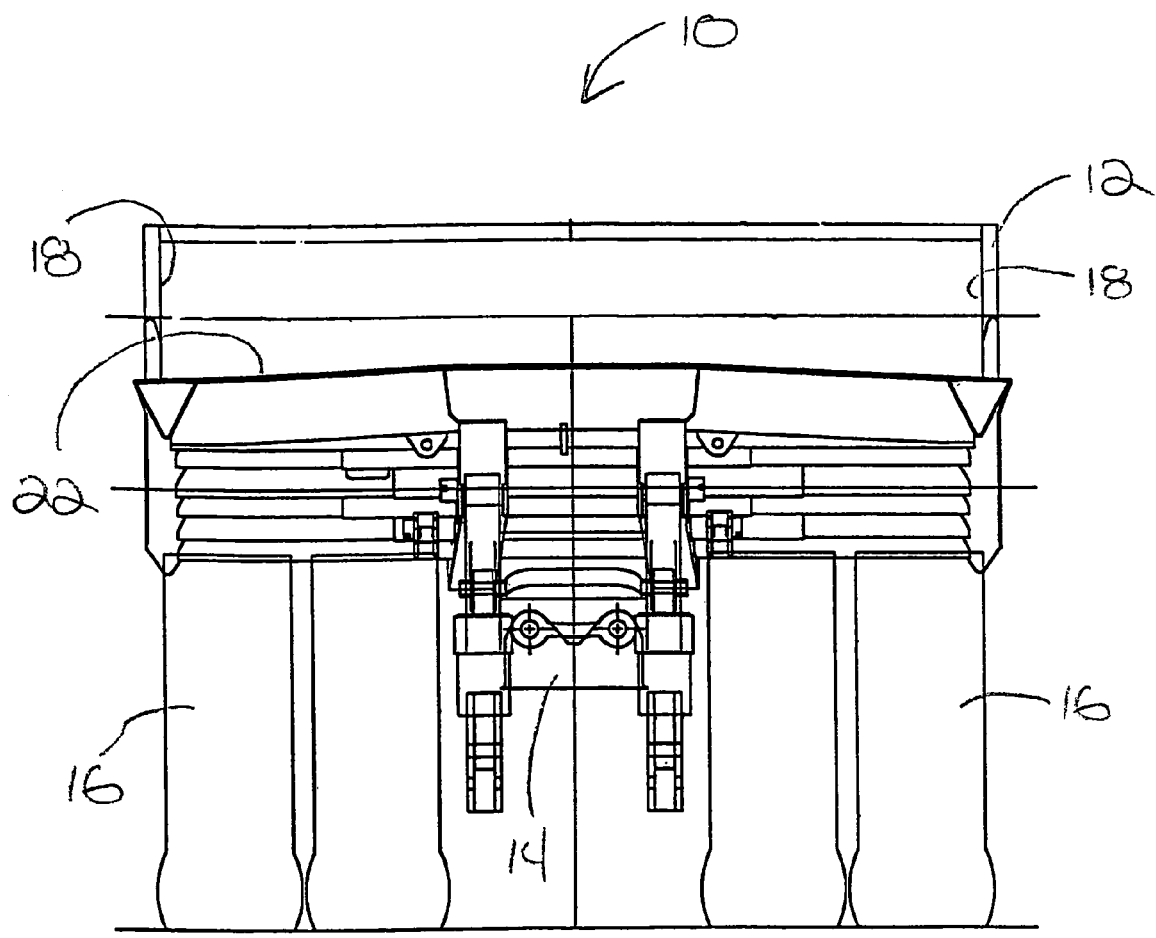
FIG. 2 is a rear view of the off-highway truck of FIG. 1.

Referring now more particularly to the drawings, there is shown in FIGS. 1 and 2 an exemplary off-highway truck 10 having a body 12 the volumetric capacity of which can be rated according to the method of the present invention. The truck 10 includes a chassis 14 to which the body 12 is attached. The chassis 14, in turn, is supported by a plurality of tires 16. The truck body 12 is generally constructed of steel panels which define the shape of the body 12 and beams which form the structural framework for the body 12. The truck body 12 comprises, in this case, side walls 18, a front wall 20 or front slope and a floor 22. It will be appreciated, however, that the method of the present invention can be used on truck bodies having any suitable configuration.

In the illustrated embodiment, the truck 10 and truck body 12 are generally symmetrical about their longitudinal axes. Accordingly, as will be appreciated, reference to plural elements where only one is shown indicates that a complementary element is disposed on the side of the truck not shown (e.g., side walls 18).

In accordance with the present invention, a method is provided for much more accurately calculating or rating the volumetric carrying capacity of a truck body. In particular, the method of the present invention provides a volumetric carrying capacity rating which much more closely approximates the actual achievable effective volumetric carrying capacity of the truck body under real-life loading conditions than the volumetric rating produced using the SAE standard methodology and other similar methodologies. Thus, the present invention allows off-highway truck end users to more easily evaluate and select truck bodies for their particular haulage application. This, in turn, leads to more efficient truck utilization, i.e. trucks carrying loads more closely matched to their volumetric and weight carrying capacity.

Step 1—Establishing the Material Angle of Repose

As a first step for determining an effective volumetric capacity rating for a particular truck body, the truck body 12 in the illustrated embodiment, an assumption has to be made with regard to the load material angle of repose α. Any suitable value can be used such as illustrated in FIG. 2a. For example, in the illustrated embodiment, a 26.6 degree angle of repose α, which corresponds to a 2:1 load heap, is used for the load heap "around" the truck body 12.

While a constant angle of repose α is used in the illustrated embodiment for ease of calculation, different angles of repose for the front, rear and sides of the load often occur. A method of designing truck bodies that can include collecting specific angle of repose data from a specific site is disclosed in copending application Ser. No. 09/333,379.

Similarly, the predetermined angle of repose α used in the method of the present invention can be based on observations of loads carried by truck bodies in the field. In such a case, the material angle of repose in the dynamic condition should be observed. Accordingly, the material angle of repose should be observed after the truck has been driven a reasonable distance and the load has stabilized.

In order to provide standard uniformity in the volumetric capacity ratings calculated according to the present invention, it may be advantageous to use a standard material angle of repose α for all calculations. Alternatively, a set of standard values may be employed with each individual standard value corresponding to a particular application (e.g., coal mine, copper mine, iron mine, etc.). Thus, when rating the volumetric capacity of a body for a particular application, the corresponding standard material angle of repose α for such material could be used. Typical angles of repose are indicated in FIG. 2a.

Step 2—Establishing Side-to-Side Profile of Generic Load

Figure 3:
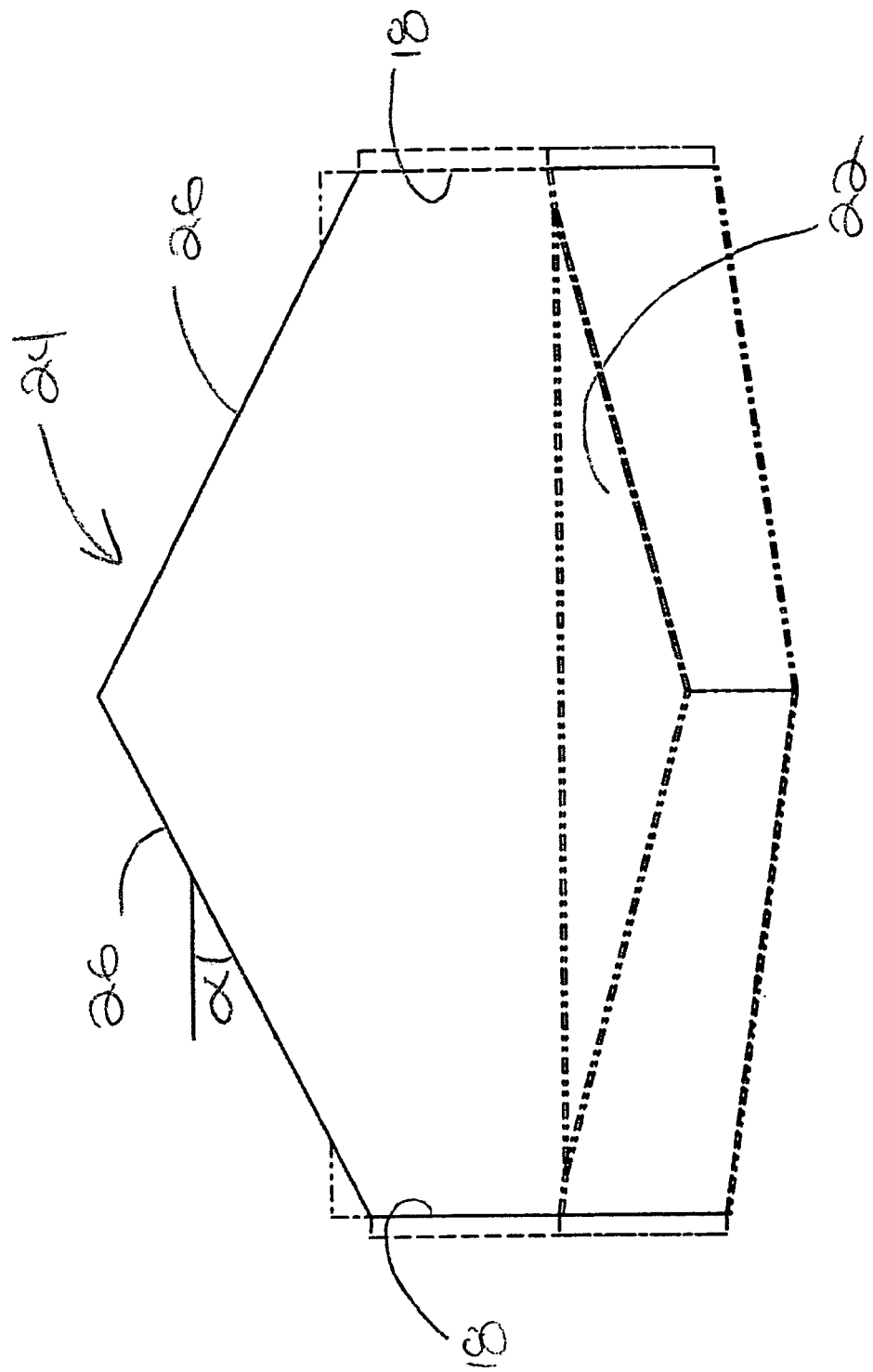
FIG. 3 is an end view of the truck body showing a step in establishing a side-to-side profile of a generic load in accordance with the present invention.

After establishing the material angle of repose α to be used, a dimensional-dimensional model of a generic load 25 (FIGS. 8, 9, 10, 11, 13, 14, 16, 17) carried by the truck body 12 is created. This generic load model 25 is preferably created using a three-dimensional solids computer aided design (CAD) system for ease of calculation. However, the present invention is not limited to being performed with CAD systems and could be performed using other systems and methods. In the illustrated embodiment, the three-dimensional generic load model 25 is begun by creating an initial side-to-side profile 24 (FIG. 3) of the generic load model 25. In particular, a load side line 26 is extended upward from the upper edge or upper inner edge of each of the side walls 18 at the predetermined angle of repose α (e.g., 26.6 degrees) to a peak in the middle using an end view of the body 12 as shown in FIG. 3.

Figure 4:
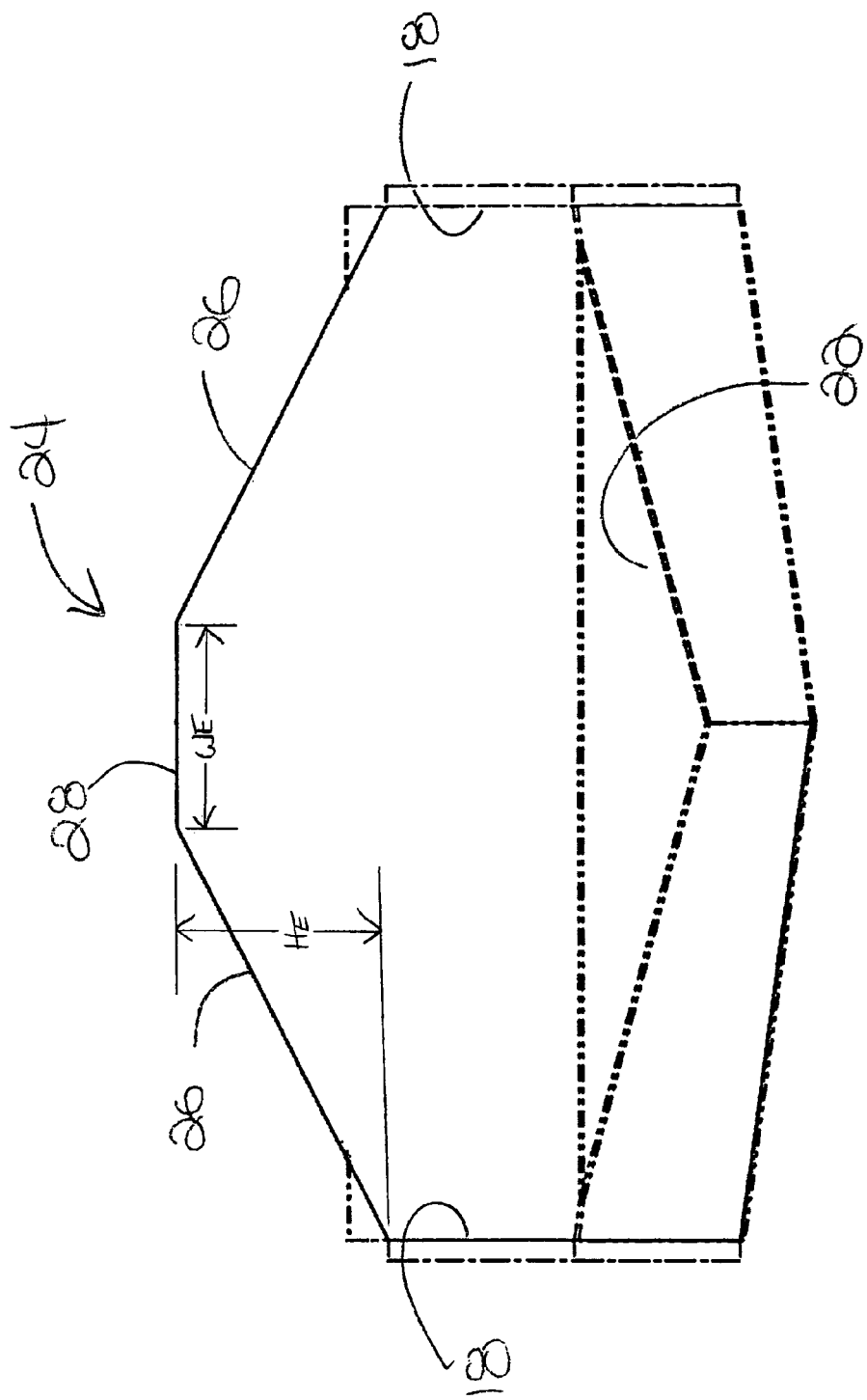
FIG. 4 is an end view of the truck body showing a further step in establishing the side-to-side profile of the generic load that includes establishing a side-to-side profile of the load plateau plane.

In reality, material carried in a dump body is rarely loaded to a perfect peak, rather a horizontally extending plateau forms on the top of the heaped load. Thus, a side-to-side profile 28 (FIG. 4) of the load plateau is next formed with a predetermined width WE in the side-to-side profile 24 of the generic load model 25 as shown in FIG. 4. In this case, the width WE of the side-to-side plateau profile line 28 is set at $1/5^{th}$ of the inside width of the truck body 12, however, any suitable value, i.e. ¼, ⅙, ⅐, ⅛, ⅑, can creating the side-to-side plateau profile line 28, the side load lines 26 of the generic load model 25 are maintained at the predetermined angle of repose α and the load peak is removed above the side-to-side plateau profile line 28, i.e. the line where the horizontal distance between the side load lines equals the predetermined width WE of the side-to-side plateau profile line 28.

Step 3—Establishing Front-to-Rear Profile of Generic Load

Figure 5:
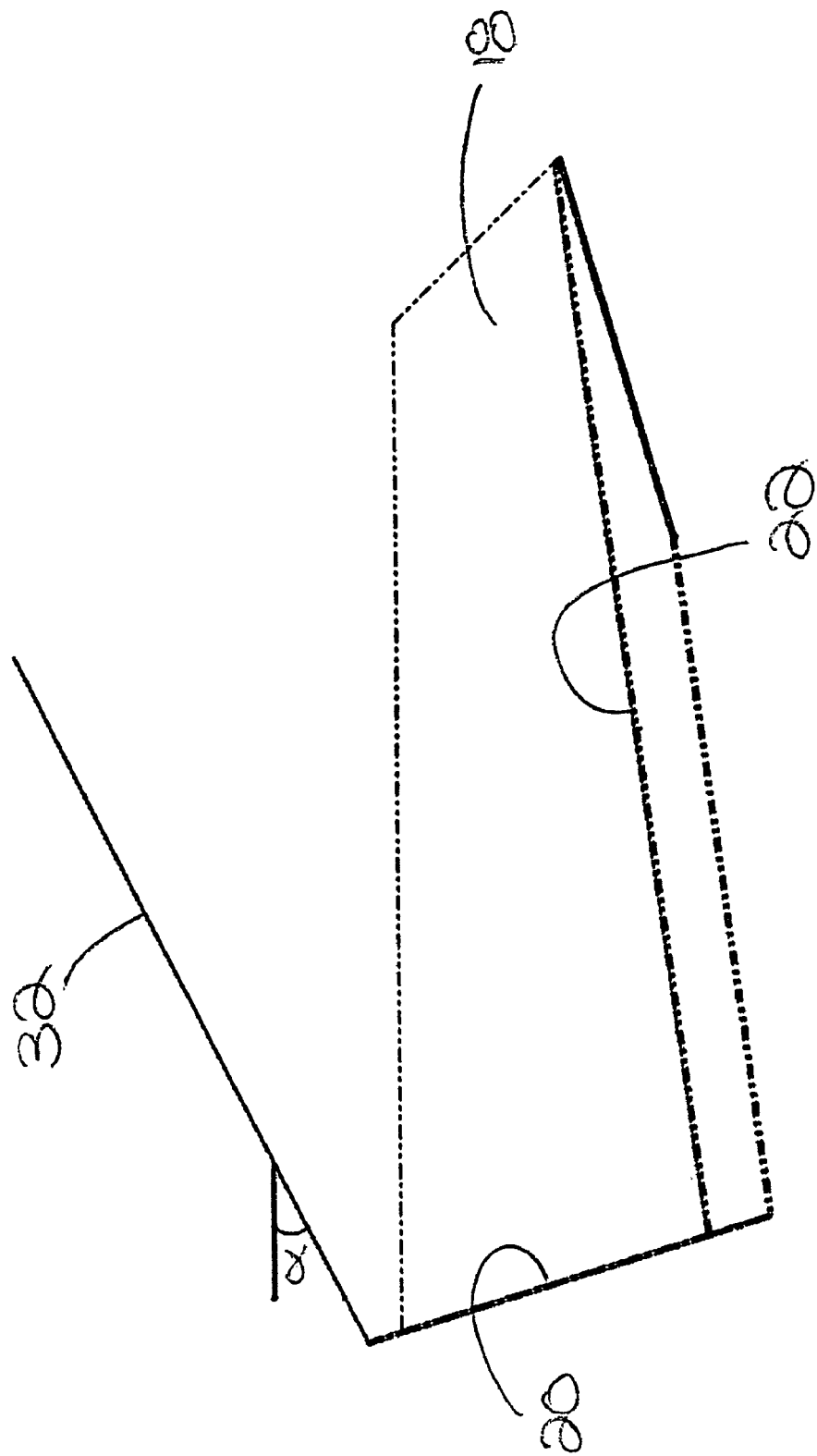
FIG. 5 is a side view of the truck body showing a step in establishing a front-to-rear profile of the generic load.

In the illustrated embodiment, as a next step, a front-to-rear profile 30 (FIG. 6) of the generic load model 25 is produced. Specifically, using a side view of the truck body 12, a front load line 32 is extended upward (FIG. 5) from the upper edge of the front body slope 20 at the predetermined material angle of repose α as shown in FIG. 5. Similarly, a rear load line 34 is extended upward (FIG. 6) from the rear edge of the floor 22 of the truck body 12 at the predetermined angle of repose α until it intersects the front load line 32 (shown in phantom in FIG. 6). In order to take into account the possibility that loading of the rear of the body 12 to a spill point is unacceptable because of the possibility of spillage out of the rear end of the body onto a haul road, the rear load line 34 can be extended upward from a point spaced a distance D (e.g., 6 inches) inward from the rear edge of the floor 22 as shown in FIG. 6.

Figure 6:
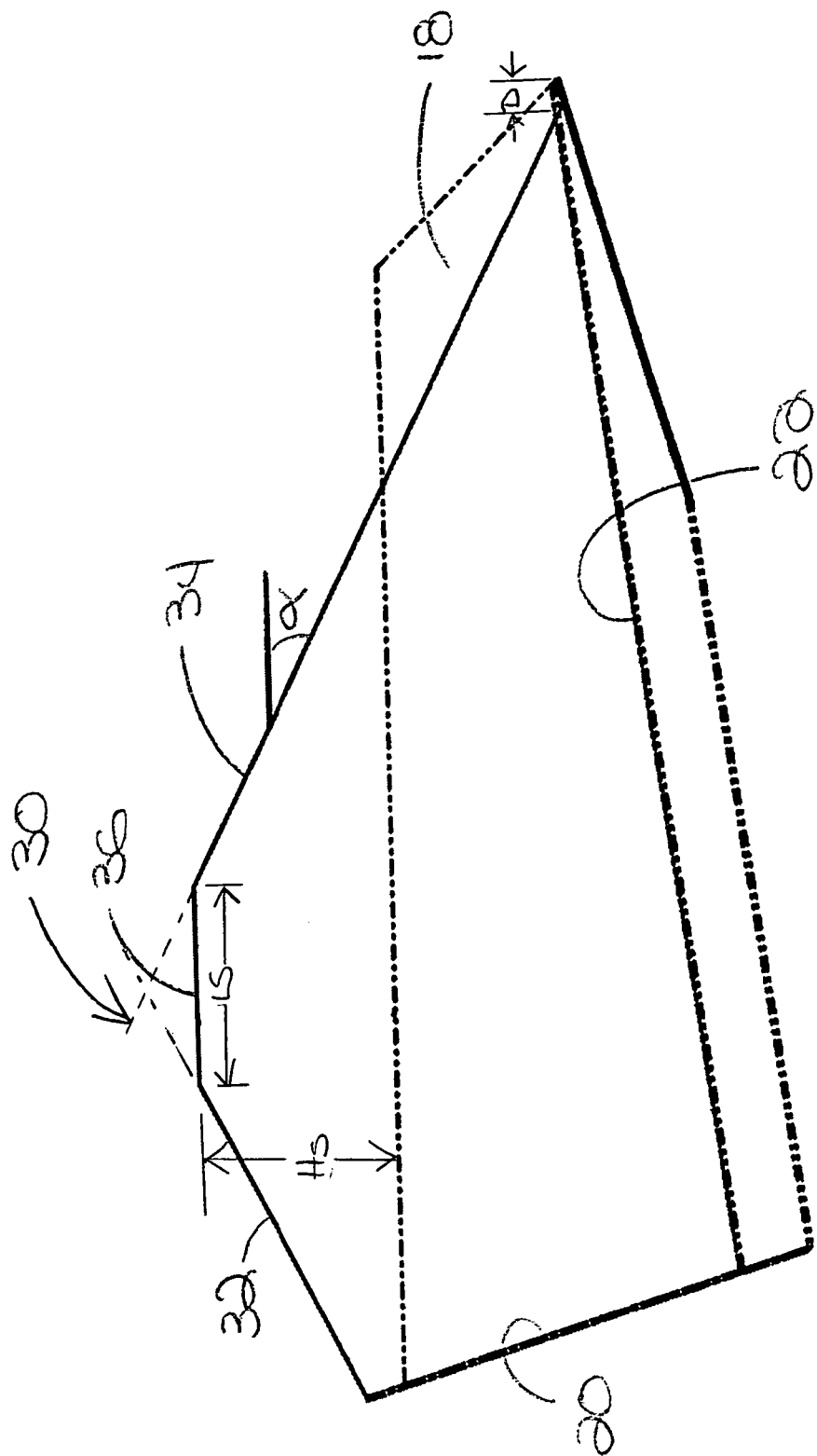
FIG. 6 is a side view of the truck body showing a further step in establishing the front-to-rear profile of the generic load that includes establishing a front-to-rear profile of the load plateau plane.

After the front and rear load lines 32, 34 are established, a front-to-rear profile 36 of the load plateau is next created (FIG. 6) with a predetermined length LS on the peak of the intersecting front and rear load lines 32, 34 as shown in FIG. 6. In this case, the front-to-rear plateau profile line 36 has a length LS equal to the width WE used in creating the side-to-side plateau profile line 28 (i.e., the step illustrated in FIG. 4). As in step 2, the angle of repose α is kept constant in creating the front-to-rear plateau profile line 36.

Step 4—Determining Maximum Height of Generic Load Model

Figure 7:
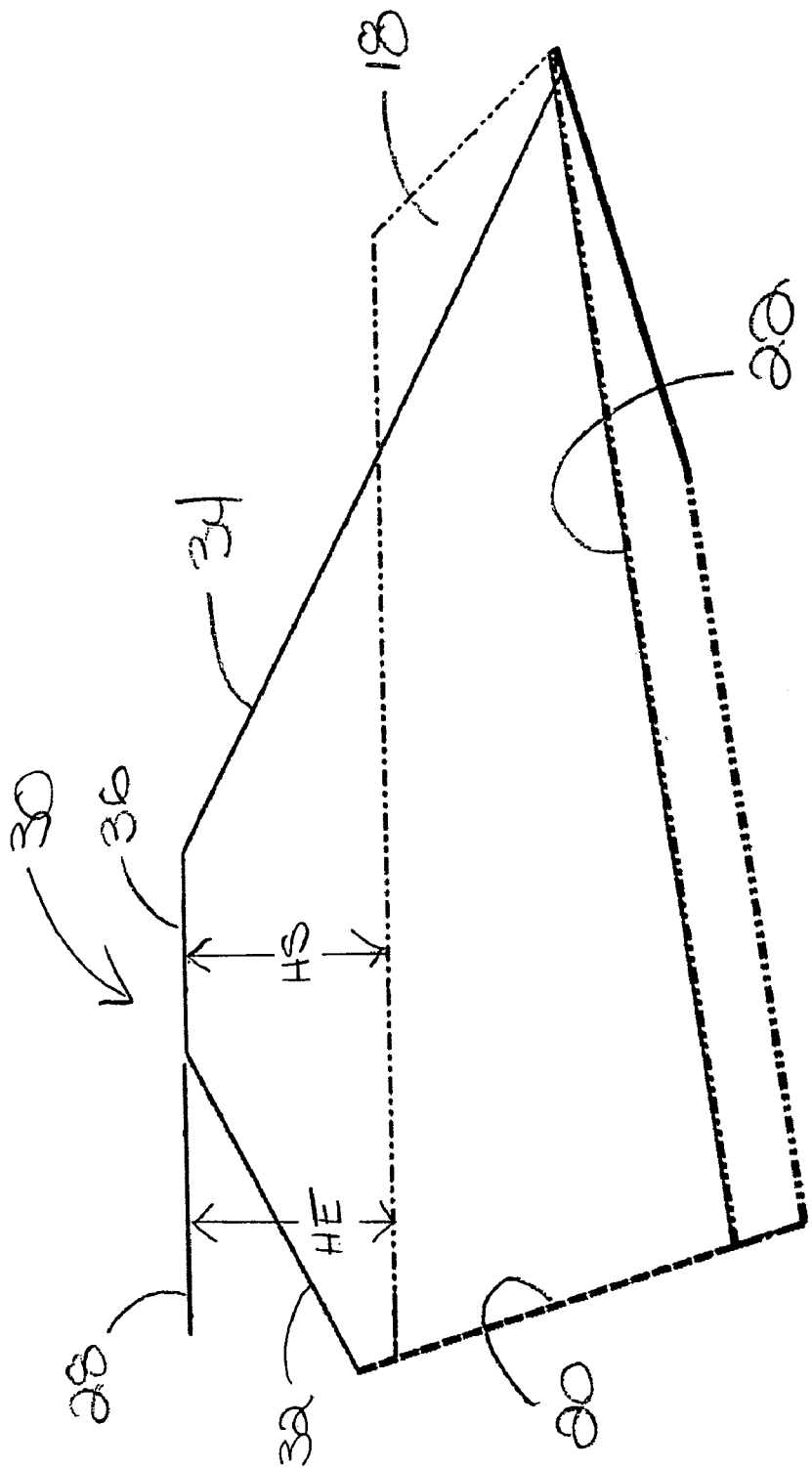
FIG. 7 is a side view of the truck body showing the difference in height between the front-to-rear profile of the load plateau plane and the side-to-side profile of the load plateau plane.

As a next step, the maximum height of the generic load model 25 is determined. This is accomplished by comparing the height HE of the side-to-side plateau profile line 28 and the height HS front-to-rear plateau profile line 36, such as shown in FIG. 7. Specifically, the final height HF (FIG. 8) of the generic load model 25 is set at the lower of the height HE of the side-to-side plateau profile line 28 and the height HS of the front-to-rear plateau profile line 36 (assuming that these two heights are different). The lower height is used because the height of an actual load in the body 12 will be limited by either the length or width of the body (unless such as in ideal situations HS equals HE). For example, in the illustrated embodiment HE exceeds HS. The true height of an actual load will not reach HE because the body 12 is not long enough at the chosen material angle of repose α to hold a load of that size.

Figure 8:
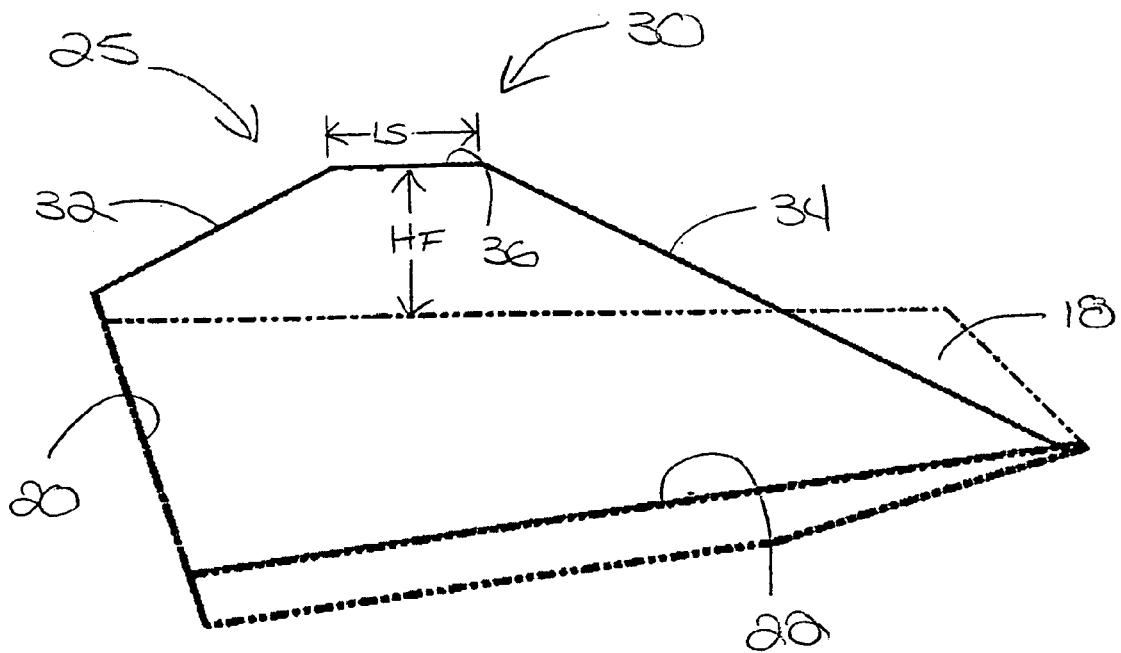
FIG. 8 is a side view of the truck body showing the final front-to-rear profile of the generic load.
Figure 9:
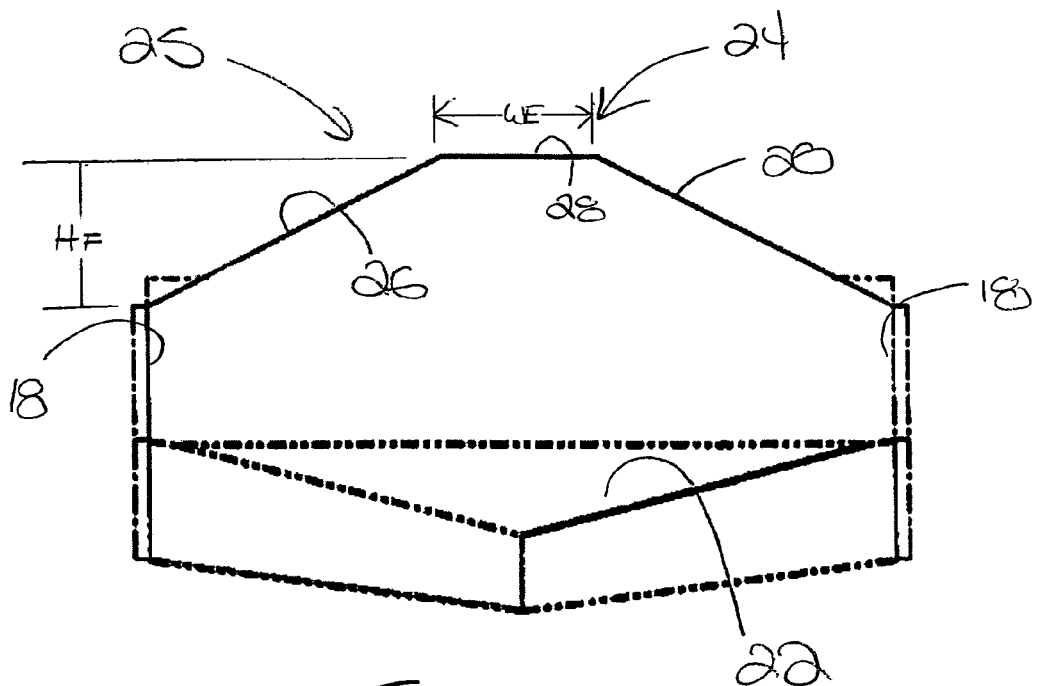
FIG. 9 is an end view of the truck body showing the final side-to-side profile of the generic load.

Once the final height HF is determined, both the side-to-side and front-to-rear plateau profiles 28, 36 are set at the final height HF above the body sides 18 (FIGS. 8 and 9 respectively). In particular, the height of the plateau line in the profile (front-to-rear or side-to-side) having the higher height above the body side 18 is lowered to the height of the lower plateau line. Thus, at this point, the plateau lines should be at the final height HF in both the side-to-side and front-to-rear profiles 24, 30 of the generic load model 25 as shown in FIGS. 8 and 9. In the profile in which the height of the plateau line was lowered, the plateau line will be longer than the predetermined distance used to initially define the plateau (i.e., WE will no longer equal LS) because the material angle of repose α of the side, front and rear load lines 26, 32, 34 remains constant.

Note that the plateau width WE should not be more than 20% larger than the original width established in Step 2. While load heaps can easily run the length of the body, load heaps running the width of the truck body are seldom if ever achievable. If the plateau width WE does exceed the original width by more than 20% it will indicate that the point where the load contacts the body side walls 18 is below the top of the side walls 18 or that the angle of repose for the material running to the body sides is less than that established in Step 1, i.e. the loading tool has to artificially push material sideways to get material to reach the top of the body side walls. When designing a body, this problem can be corrected by lengthening the body in the front-to-rear view or profile.

It will be appreciated that the steps 2 and 3 described above and illustrated in FIGS. 3-7 do not have to be performed in any particular order so long as side-to-side and front-to-rear profiles 24, 30 of the generic load model 25 are established and the height and length of the load plateau lines are defined. For example, the front-to-rear profile 30 of the generic load model 25 can be produced prior to the side-to-side profile 24.

Step 5—Defining Shape of Load Plateau

Figure 10:
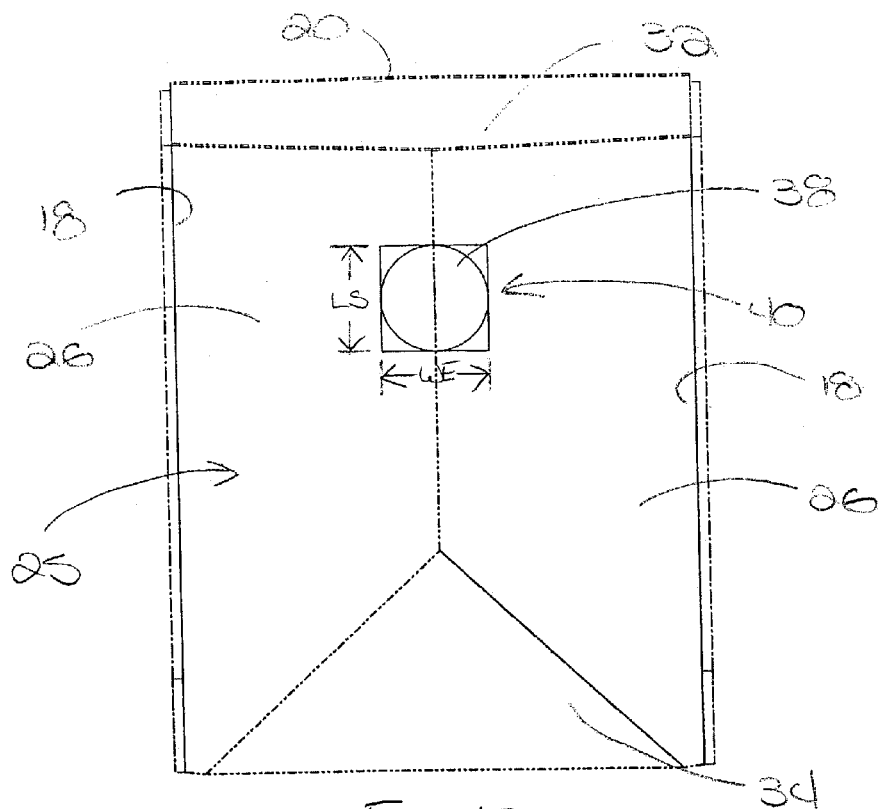
FIG. 10 is a top view of the truck body and generic load showing how the load plateau plane is transformed into a generally circular or oval shaped load plateau.

At this stage, the side, front and rear load lines 26, 32, 34 and the load plateau lines 28, 36 define the generic load model 25. In order to more accurately reflect the shape of an actual load heap carried in a truck body 12, the generic load model 25 is next molded into a more conical shape. In the illustrated embodiment, this is accomplished by first creating a top load plateau profile 40 which in most cases will be oblong in nature though it could also be round if HS and HE are the same height. As shown in FIG. 10, the load plateau as defined by the side-to-side and front-to-rear profile lines initially has a rectangular shape when viewed from the top (because WE no longer equals LS). To more accurately reflect the shape of an actual load plateau, this rectangular shape must be converted into a rounder oblong or oval shape. In this case, the final top load plateau profile 40 is produced by inscribing an oval or circle within the lines of the rectangle. This oval or circle becomes the outer boundary of the load plateau 38.

Step 6—Contouring Generic Load to Produce a More Conical Shape

Figure 11:
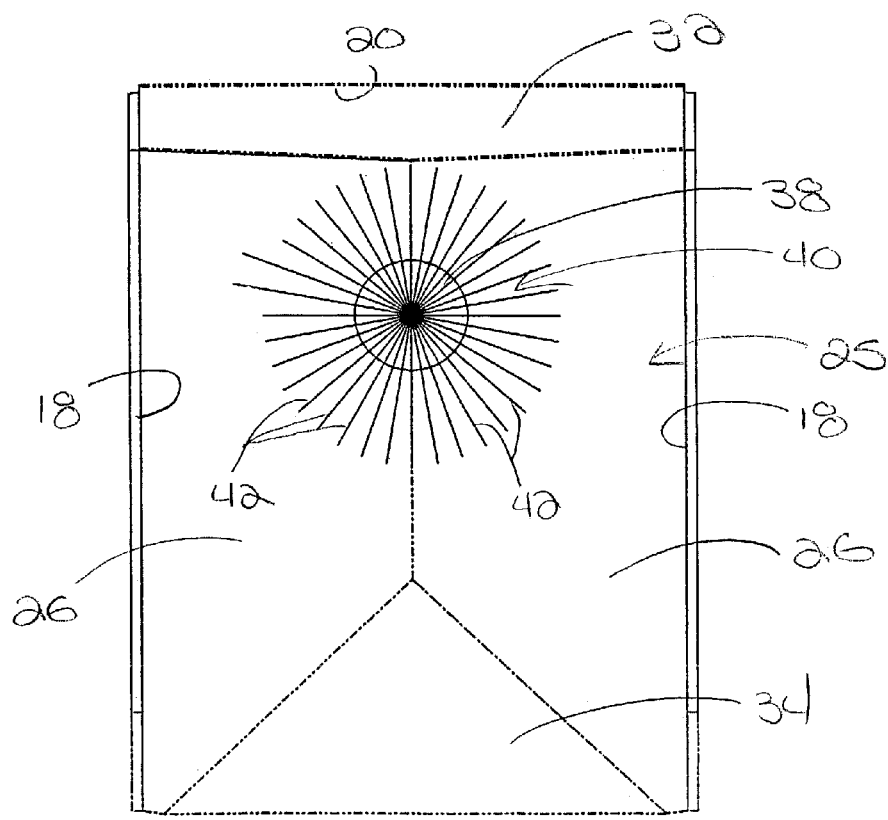
FIG. 11 is a top view of the truck body and the generic load showing how the load plateau can be divided into pie-shaped segments.

Using the oval shaped top profile 40 of the load plateau 38 as the starting point, the side, front and rear load lines 26, 32, 34 of the generic load model 25 produced in creating the side-to-side and front-to-rear profiles 24, 30 of the generic load model 25 are contoured so that the generic load model 25 more closely resembles a conical shape. In this case, the oval shaped load plateau top profile 40 is divided into a plurality of pie-shaped increments by boundary lines 42 as shown in FIG. 11. The boundary lines 42 defining the pie shaped increments are spaced at equal angular intervals. In the illustrated embodiment, the load plateau 38 is divided into thirty-six 10 degree pie-shaped segments. Since it is anticipated that an actual load will be symmetrical about the centerline of the body 12, the load plateau 38 could be divided in increments 42 only to one side of the body 12 (e.g., eighteen 10 degree increments). The opposite side of the generic load model 25 would then be formed as a mirror image of the side divided into increments.

Figure 12:
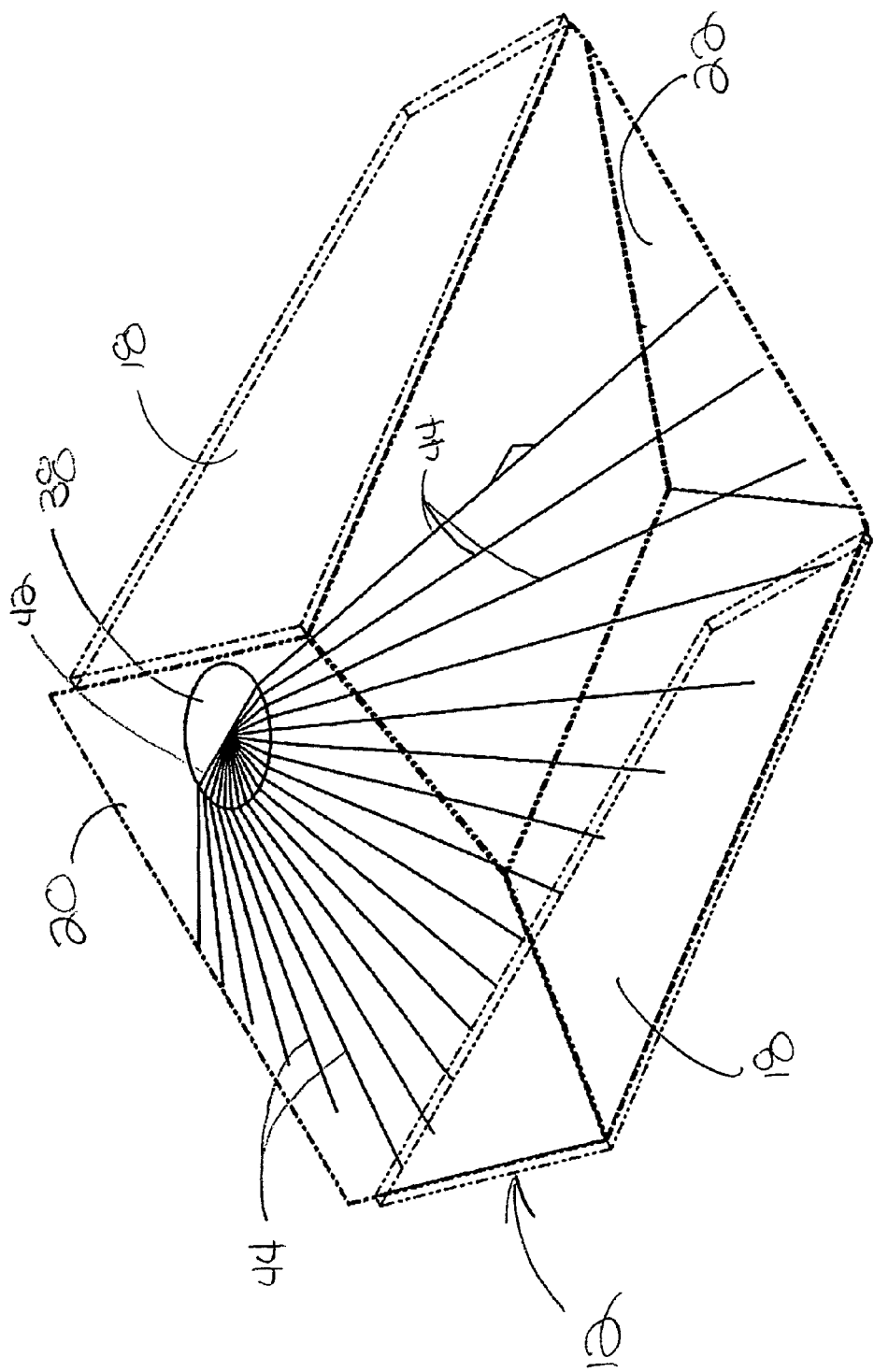
FIG. 12 is a perspective view of the truck body and the generic load showing how the load profile lines are extended from the load plateau to the inside surface of the truck body.
Figure 13:
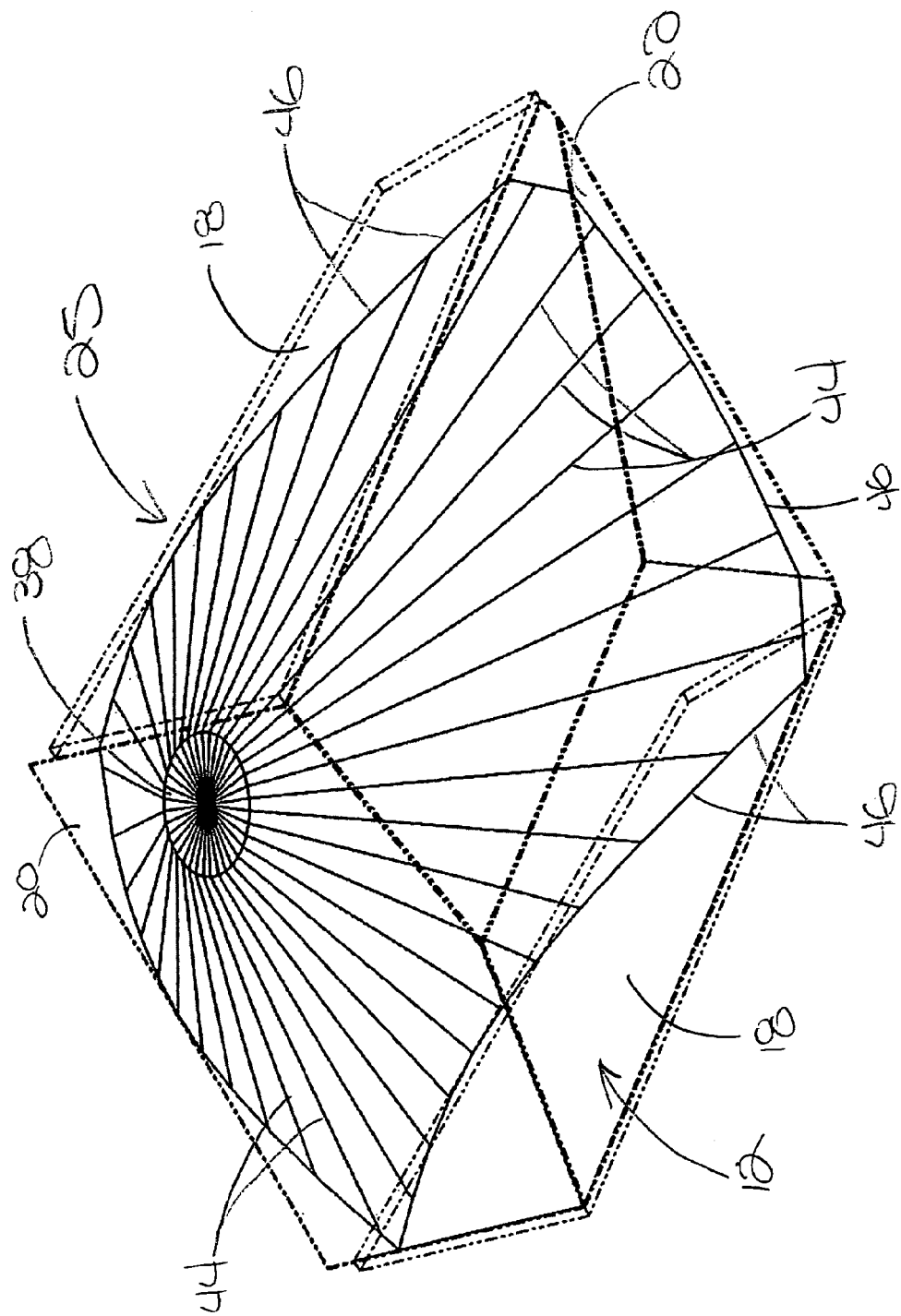
FIG. 13 is a perspective view of the truck body and the generic load model showing how the lines of contact between the generic load and the inside surface of the truck body are defined.
Figure 14:
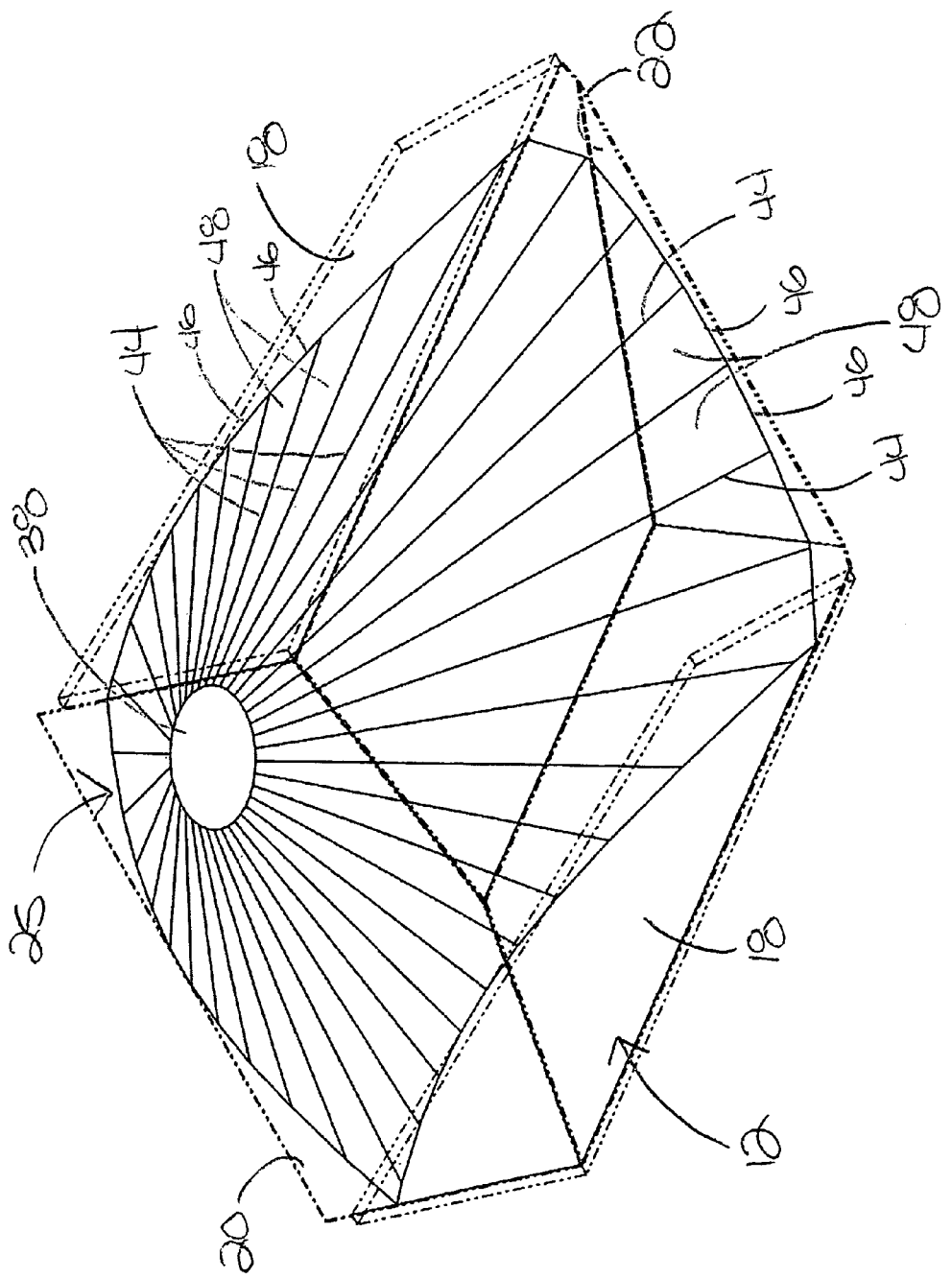
FIG. 14 is a perspective view of the truck body and the generic load model.

For each pie-shaped segment boundary line 42, a contour line 44 (FIG. 12) is extended downward at the predetermined material angle of repose α from the edge of the oval-shaped plateau 38 perpendicular to the tangent line of the plateau 38 at that point until the contour line 44 intersects the inside surface of the truck body 12 as shown in FIG. 12. To define the lines of contact between the generic load model 25 and the sidewalls 18, front slope 20 and floor 22 of the body 12, the points where the contour lines 44 contact the inside of the truck body 12 are connected to form a series of contact line segments 46 as shown in FIG. 13. The upper surface of the load model 25 is then formed (FIG. 14) by extending a contour plane 48 between each adjacent pair of the contour lines 44 from the plateau to the respective body contact line segment 46. These contour planes 48 shape the upper surface of the generic load model 25 into a generally conical shape as shown in FIG. 14.

Step 7—Determine Volumetric Capacity Rating

The volume of the three-dimensional generic load model 25 is then calculated. This volume represents the effective volumetric carrying capacity of the truck body 12. The volume of the dimensional-dimensional generic load model 25 is most easily calculated using a CAD system. However, it is conceivable that the volume could be calculated using other methods.

Figure 15A:
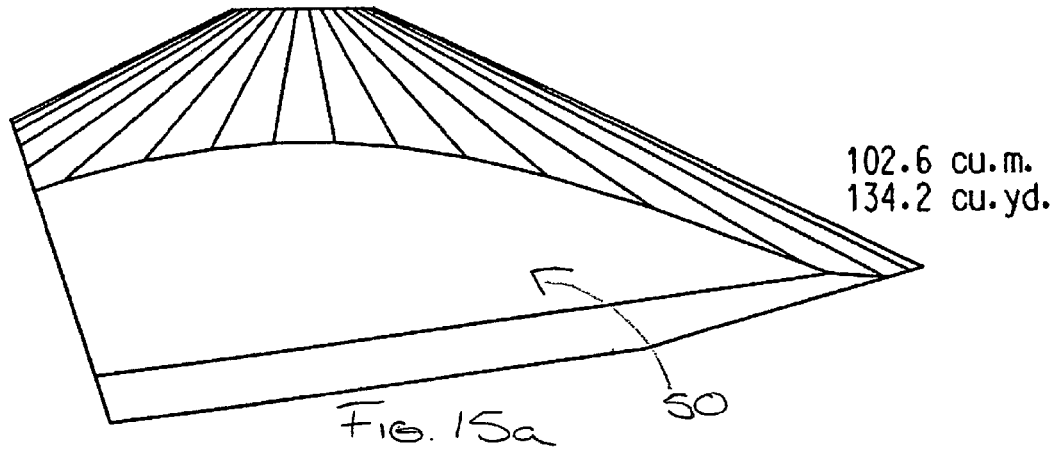
FIGS. 15a, b, and c are comparison diagrams showing the difference between the truck body volumetric capacity rating as calculated in accordance with the present invention (FIG. 15a) and the rating based on a true 2:1 heap (FIG. 15b) and the SAE volumetric capacity rating (FIG. 15c).
Figure 15B:
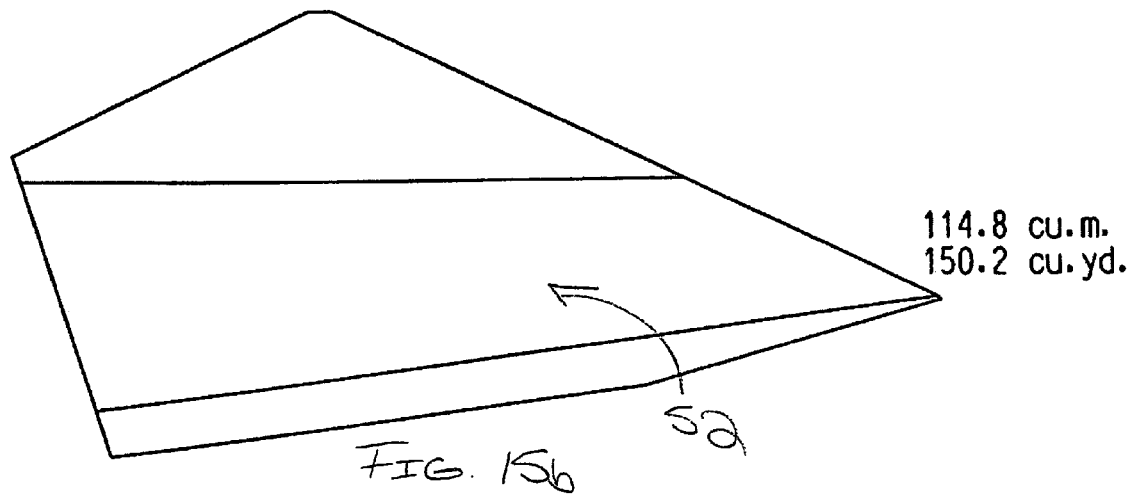
Figure 15C:
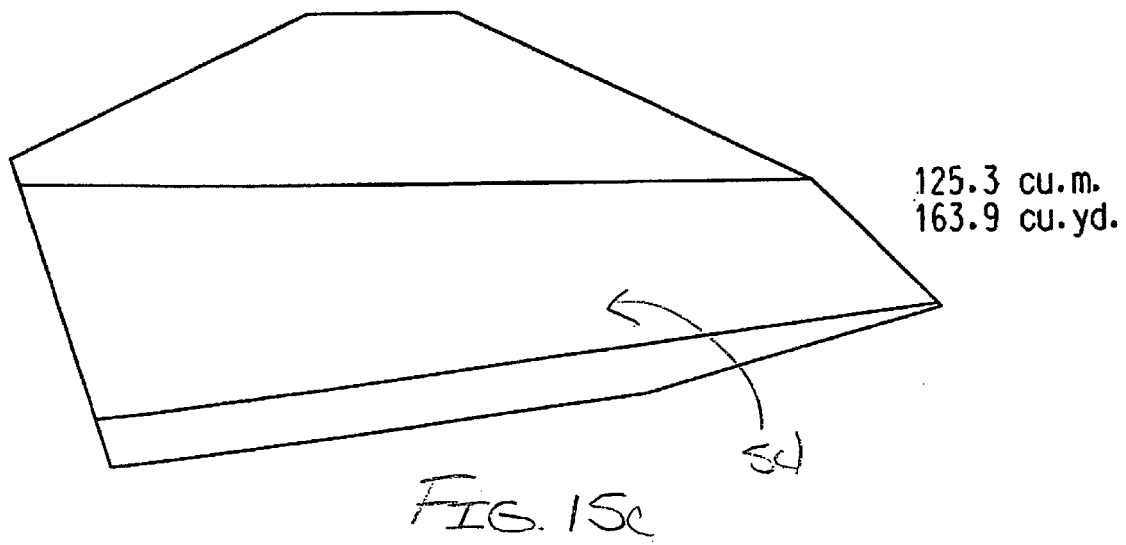

An example of the significant difference between the effective volumetric capacity rating as calculated using the method of the present invention and the capacity rating calculated using conventional methods is illustrated in FIGS. 15*a-c*. In particular, three dimensionally identically sized truck bodies are illustrated in FIGS. 15*a-c*. The effective volumetric capacity of the first truck body 50 (FIG. 15*a*) has been rated using the method of the present invention. The volumetric capacity of the second truck body 52 (FIG. 15*b*) has been rated based on a load model using only a 2:1 heap (i.e., where the 2:1 slope is maintained from the floor edge at the rear of the body) and flat planes. Finally, the volumetric capacity of the third truck body 54 (FIG. 15*c*) has been rated based on the method set forth in the SAE standard. As can be seen from FIG. 15, the volumetric capacity rating produced using the present invention (FIG. 15*a*) is approximately 18% less that the rating produced using the SAE standard (FIG. 15*c*) and approximately 11% less than the rating produced using a true 2:1 heap (FIG. 15*b*).

In order to maximize the volumetric load carrying capacity of a truck body 12, the height of the side walls 18 and the length of the body 12 must also be properly matched. This becomes evident when the method of the present invention is used to rate the volumetric carrying capacity of a truck body 12 which has been modified with sideboards 56 or a tail extension 58. For example, FIG. 16 illustrates a completed generic load model 25 that has been produced using the method of the present invention for a truck body 12 having sideboards 56. The sideboards 56 increase the height of the side walls 18 of the body 12, however, they can not be fully utilized because the volumetric capacity of the body 12 is limited by the length of the floor 22 which has been kept constant. In particular, when performing steps 2-4 (FIGS. 3-10) of the present invention, the height HS (FIG. 6) of the front-to-rear plateau profile line 36 (which takes into account the length of the floor) is lower than the height HE (FIG. 4) of the side-to-side plateau profile line 28 (which takes into account the height of the side walls 18 plus the sideboards 56). Thus, the side-to-side plateau profile line 28 (FIG. 4) must be lowered to correspond to the height HS of the front-to-rear plateau profile line 36 (FIG. 6), thereby limiting the effectiveness of the sideboards 56 with regard to increasing the volumetric carrying capacity of the truck body 12.

The opposite is true if the truck body 12 is lengthened, such as by using a tail extension 58, while the side walls 18 are kept at the same height such as shown in FIG. 17. Specifically, in such a case the height of the side walls 18 limits the volumetric carrying capacity of the truck body 12 because the height HE of the side-to-side plateau profile line 28 is lower than the height HS of the front-to-rear plateau profile line 36. This fact can be compensated some by lengthening the length of the final load plateau 38, however the typical problem with lengthening the final load plateau is that the center of gravity of the load model 25 is shifted rearward which may create an out of balance condition relative to the truck that is carrying the truck body and in lengthening the rear of the truck body the ground clearance of the truck body when dumped may be below the minimum required by statutory guidelines. Typical statutory regulations require that when dumped the rear lower corner of the truck body be no lower than the centerline of the axle of the truck on which the dump body is mounted. Otherwise, the height of the load plateau line has to be lowered in the front-to-rear profile thereby limiting the extra volumetric carrying capacity and limiting the length of the tail extension 58.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventor for carrying out the invention. Of course, variations of those preferred embodiments will become apparent to those of ordinary skill in the art upon reading the foregoing description. The inventor expects skilled artisans to employ such variations as appropriate, and the inventor intends for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for estimating the volumetric capacity of a truck body having a pair of side walls, a front wall and a floor, comprising the steps of:
   (a) establishing a truck body side-to-side load profile cross-section by extending a side load line upward and inward at a predetermined angle from an upper edge of each of the truck body side walls to a side-to-side load profile cross-sectional peak;
   (b) cutting off the side-to-side load profile cross-sectional peak with a horizontal side-to-side load plateau line of a predetermined length while maintaining the side load lines at the predetermined angle;
   (c) establishing a truck body front-to-rear load profile cross-section by extending a front load line upward and rearward from an upper edge of the truck body front wall at the predetermined angle and by extending a rear load line upward and forward at the predetermined angle from at or near a rear edge of the truck body floor to a front-to-rear load profile cross-sectional peak;
   (d) cutting off the front-to-rear load profile cross-sectional peak with a horizontal front-to-rear load plateau line of a predetermined length while maintaining the front and rear load lines at the predetermined angle;
   (e) adjusting the final height of the side-to side and front-to-rear load plateau lines to the lesser of the height of the side-to-side load plateau line in the side-to-side load profile cross-section as produced in step (b) and the height of the front-to-rear load plateau line in the front-to-rear load profile cross-section as produced in step (d);
   (f) creating a top load plateau profile from the side-to-side and front-to-rear load profile cross-sections at the load plateau line height produced in step (e), the top load plateau profile defining a polygonal shape;
   (g) adjusting the shape of the top load plateau profile by defining a final outer boundary of the top load plateau profile as a closed curve inscribed in the polygonal shape from step (f);
   (h) contouring the side load lines produced in step (a) and the front and rear load lines produced in step (c) around and below the final outer boundary of the top load plateau profile into a generally conically shaped heaped outer surface inclined at the predetermined angle to form a final three-dimensional load model, wherein (i) an upper surface of the final three-dimensional load model is defined by the top load plateau profile from step (g) and by the conically shaped heaped outer surface between the top load plateau profile and where the generally conically shaped heaped outer surface intersects the truck body, (ii) side surfaces of the final three-dimensional load model are generally defined by the truck body side walls, front wall and floor, and (iii) the lower surface of the final three-dimensional load model is generally defined by the truck body floor; and
   (i) calculating the volume of the final three-dimensional load model.

2. The method of claim 1 wherein the predetermined length of the side-to-side load plateau line of step (b) equals the predetermined length of the front-to-rear load plateau line of step (d).

3. The method of claim 2 wherein the predetermined length of the side-to-side load plateau line of step (b) and the predetermined length of the front-to-rear load plateau line of step (d) equal approximately 20% of the distance between the side walls of the truck body.

4. The method of claim 1 wherein the predetermined angle is 26.6°.

5. The method of claim 1 wherein the step of contouring the side load lines and the front and rear load lines comprises the steps of extending a plurality of contour lines downward at the predetermined angle at equal angular intervals around the final outer boundary of the top load plateau profile until the contour lines intersect the truck body, extending contact lines between the points where adjacent pairs of contour lines intersect the truck body, and extending contour planes between each adjacent pair of the contour lines from the final outer boundary of the top load plateau profile to the respective contact line.

6. The method of claim 1 wherein the side load lines in step (a) are extended upward and inward from an upper inner edge of the side walls of the truck body.

7. The method of claim 1 further including the step of selecting the predetermined angle.

8. A method for estimating the volumetric capacity of a truck body having walls and a floor, comprising:
   establishing a truck body load profile in three dimensions;
   contouring the load profile around the truck body into a generally conically shaped heap to form a three-dimensional load model,
   determining a height of a top load plateau profile of the three-dimensional load model based on dimensions of the truck body;
   creating the top load plateau profile at the determined height below the intersection of the conically shaped heap;
   wherein an upper surface of a final thee-dimensional load model is defined by the top load plateau profile and by the conically shaped heap between the top load plateau profile and where the generally conically shaped heap intersects the truck body's walls and floor; and
   calculating a volume of the final three-dimensional load model.

9. The method of claim 8 wherein slopes of the generally conically shaped heap are substantially constant about the heap.

10. The method of claims 8 wherein slopes of the generally conically shaped heap vary about the heap.

11. The method of claim 8 wherein the truck body load profile is of a generic load of material.

12. The method of claim 11 wherein establishing the truck body load profile includes compositing planar surfaces into three dimensions to approximate a volume of the generic load carried by the truck body.

13. The method of claim 8 wherein the shape of the load is different for differently shaped bodies but the conical shape of the heaped material is the same.

14. The method of claim 8 wherein the height of the top load plateau profile is determined before the load profile is contoured around the truck body.

15. The method of claim 14 wherein the top load plateau profile is created before the load profile is contoured around the truck body.

16. The method of claim 8 wherein a lower surface of the final three-dimensional load model is defined by the walls and floor of the truck body.

17. The method of claim 16 wherein the lower and upper surfaces of the final three dimensional load model combine to form the final three-dimensional load.

18. A method for estimating the volumetric capacity of a truck body having walls and a floor, comprising:
　　establishing a generic three-dimensional load by
　　　(1) modeling a heap of generic material in three dimensions held in the truck body, wherein a lower portion of the modeled heap is shaped by the walls and floor of the truck body and an upper portion of the modeled heap extends upwardly from the lower portion in a generally conical shape toward a peak, and
　　　(2) forming a plateau in the conical shape below the peak and at a height of the conical shape determined by dimensions of the truck body; and
　　calculating a volume of the generic three-dimensional load.

19. The method of claim 18 wherein the modeling of the heap of generic material includes compositing planar surfaces into three dimensions to approximate a volume of the generic material carried by the truck body, where each of the planar surfaces represents an angled slope of a profile of the heap of generic material.

20. The method of claim 19 wherein values of the angled slopes are substantially the same for all of the planar surfaces.

* * * * *